United States Patent
Xie et al.

(10) Patent No.: US 9,318,388 B2
(45) Date of Patent: Apr. 19, 2016

(54) METHODS OF FORMING SUBSTANTIALLY SELF-ALIGNED ISOLATION REGIONS ON FINFET SEMICONDUCTOR DEVICES AND THE RESULTING DEVICES

(71) Applicant: GLOBALFOUNDRIES Inc., Grand Cayman (KY)

(72) Inventors: Ruilong Xie, Niskayuna, NY (US); Vimal K. Kamineni, Albany, NY (US); Abner F. Bello, Clifton Park, NY (US); Nicholas V. LiCausi, Watervliet, NY (US); Wenhui Wang, Clifton Park, NY (US); Michael Wedlake, Albany, NY (US); Jason R. Cantone, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/725,663

(22) Filed: May 29, 2015

(65) Prior Publication Data

US 2015/0294912 A1    Oct. 15, 2015

Related U.S. Application Data

(62) Division of application No. 14/079,159, filed on Nov. 13, 2013, now Pat. No. 9,093,302.

(51) Int. Cl.

| H01L 21/84 | (2006.01) |
|---|---|
| H01L 21/8238 | (2006.01) |
| H01L 21/8234 | (2006.01) |
| H01L 27/088 | (2006.01) |
| H01L 29/06 | (2006.01) |
| H01L 29/165 | (2006.01) |

(Continued)

(52) U.S. Cl.
CPC .. *H01L 21/823431* (2013.01); *H01L 21/02164* (2013.01); *H01L 21/02381* (2013.01); *H01L 21/02532* (2013.01); *H01L 21/308* (2013.01); *H01L 21/32133* (2013.01); *H01L 21/76224* (2013.01); *H01L 21/823437* (2013.01); *H01L 21/823481* (2013.01); *H01L 21/823821* (2013.01); *H01L 21/845* (2013.01); *H01L 27/0886* (2013.01); *H01L 27/0924* (2013.01); *H01L 27/10879* (2013.01); *H01L 27/1211* (2013.01); *H01L 29/0649* (2013.01); *H01L 29/165* (2013.01); *H01L 29/6681* (2013.01); *H01L 29/66787* (2013.01); *H01L 29/66795* (2013.01); *H01L 29/7843* (2013.01)

(58) Field of Classification Search
CPC .............. H01L 21/845; H01L 21/823821; H01L 27/0924; H01L 27/1211; H01L 27/10879; H01L 29/66795; H01L 29/66787
See application file for complete search history.

(56) References Cited

U.S. PATENT DOCUMENTS

| 7,235,436 B1 | 6/2007 | Lin et al. |
| 8,076,231 B2 | 12/2011 | Saitoh et al. |
| 8,159,018 B2 | 4/2012 | Akil et al. |
| 2010/0155827 A1 | 6/2010 | Kim et al. |

(Continued)

*Primary Examiner* — Phat X Cao
(74) *Attorney, Agent, or Firm* — Amerson Law Firm, PLLC

(57) ABSTRACT

One method disclosed includes performing a selective etching process through a gate cavity to selectively remove a portion of a first semiconductor material relative to a second layer of a second semiconductor material and a substrate so as to thereby define a space between the second semiconducting material and the substrate, filling substantially all of the space with an insulating material so as to thereby define a substantially self-aligned channel isolation region positioned under at least what will become the channel region of the FinFET device.

18 Claims, 21 Drawing Sheets

(51) Int. Cl.
*H01L 29/66* (2006.01)
*H01L 27/092* (2006.01)
*H01L 27/12* (2006.01)
*H01L 27/108* (2006.01)
*H01L 21/02* (2006.01)
*H01L 21/308* (2006.01)
*H01L 21/3213* (2006.01)
*H01L 21/762* (2006.01)
*H01L 29/78* (2006.01)

(56) References Cited

U.S. PATENT DOCUMENTS

| | | |
|---|---|---|
| 2011/0097881 A1 | 4/2011 | Vandervorst et al. |
| 2012/0037994 A1 | 2/2012 | Saitoh et al. |
| 2014/0264600 A1* | 9/2014 | Adam .................. H01L 29/785 257/347 |
| 2014/0367800 A1 | 12/2014 | Lee et al. |
| 2014/0377917 A1 | 12/2014 | He et al. |
| 2015/0021663 A1 | 1/2015 | Akarvardar et al. |
| 2015/0028426 A1 | 1/2015 | Ching et al. |

* cited by examiner

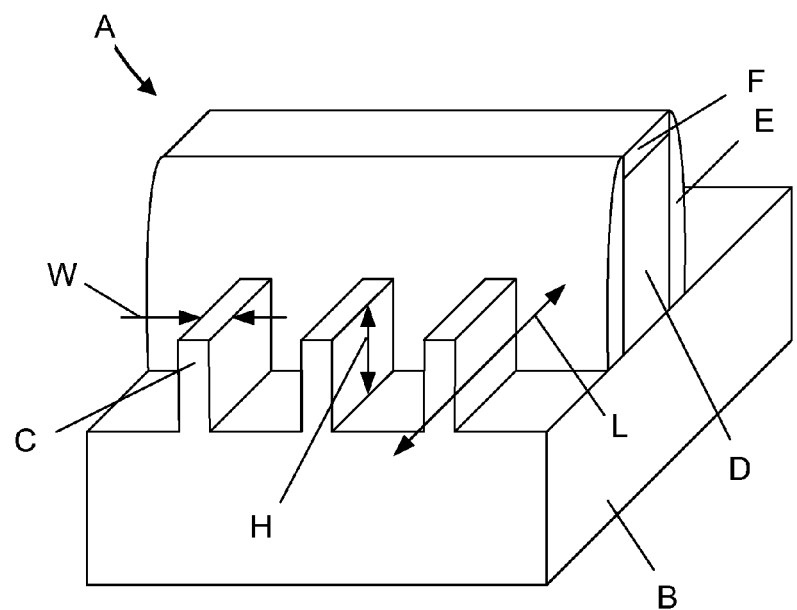
Figure 1A (Prior Art)
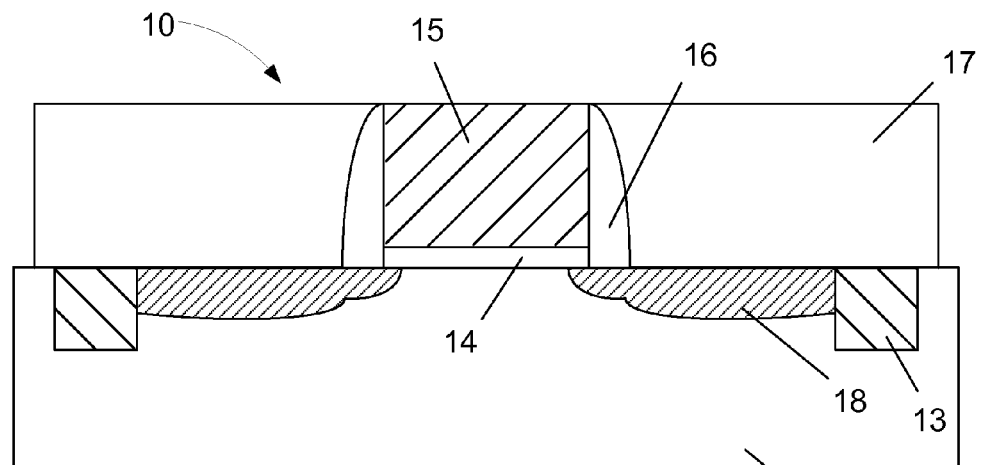
(Prior Art) Figure 1B

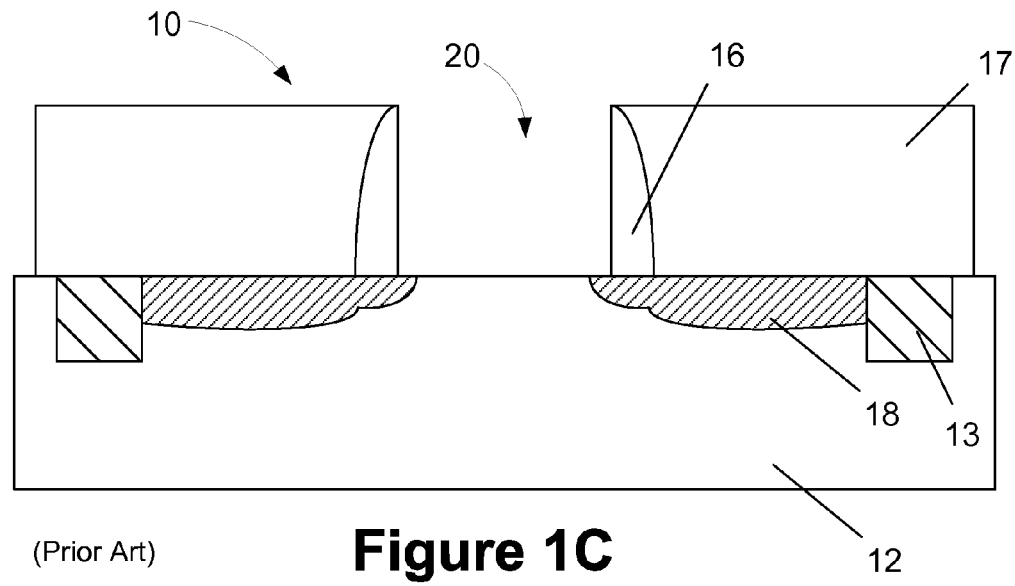
(Prior Art) Figure 1C
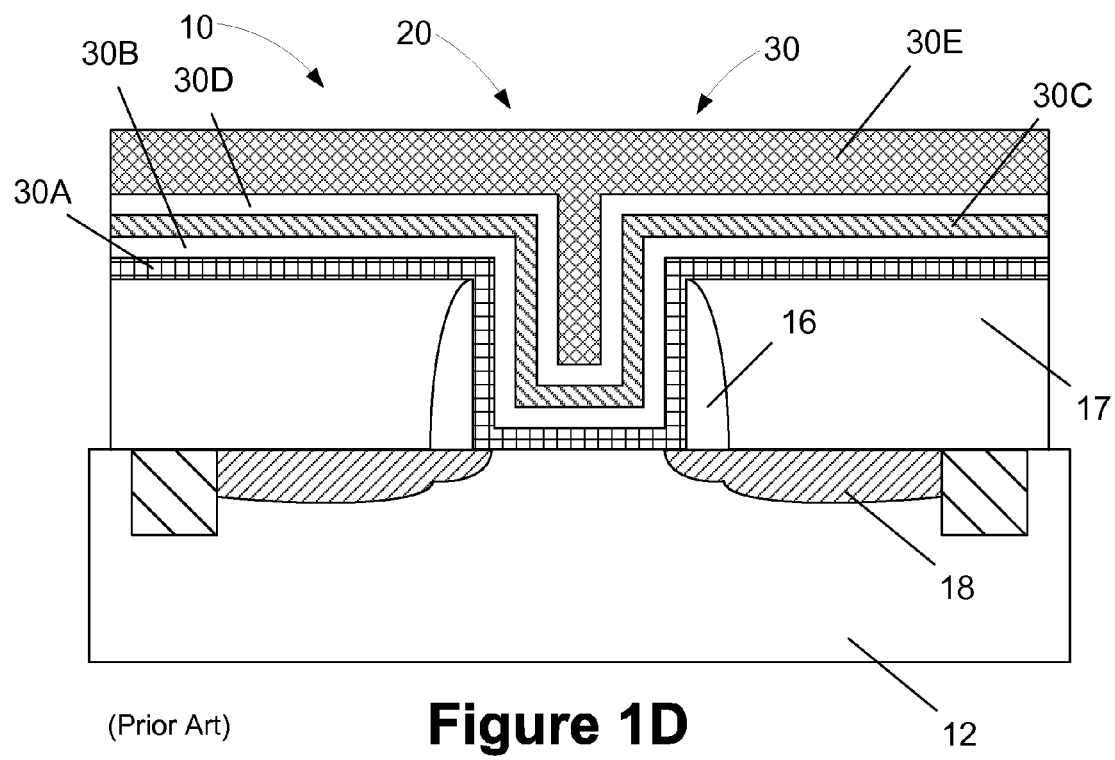
(Prior Art) Figure 1D

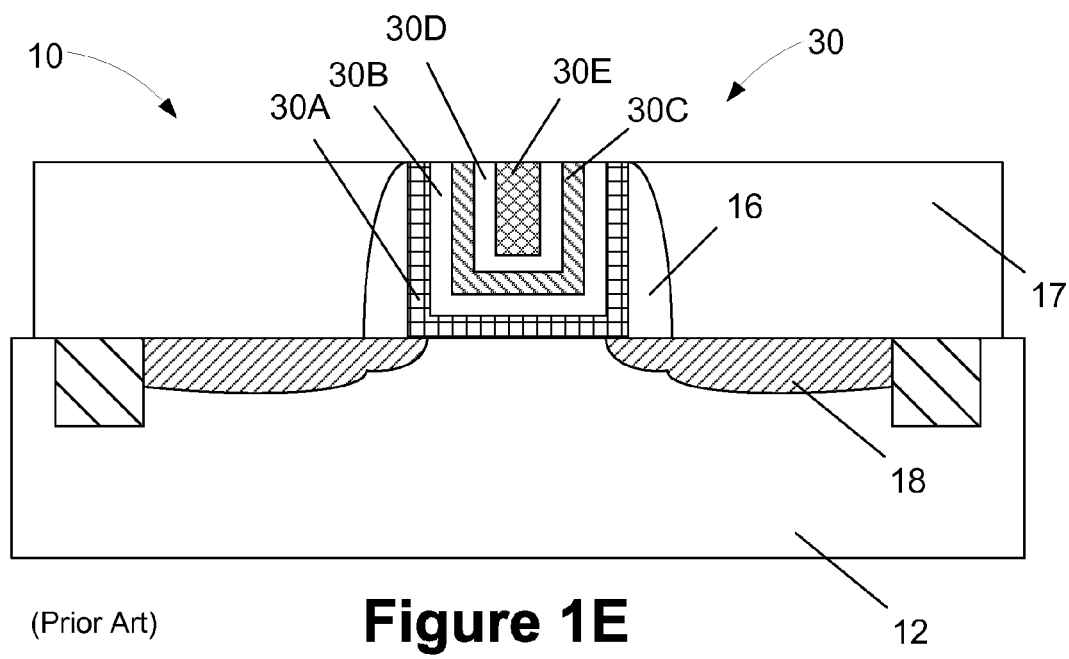
(Prior Art) Figure 1E
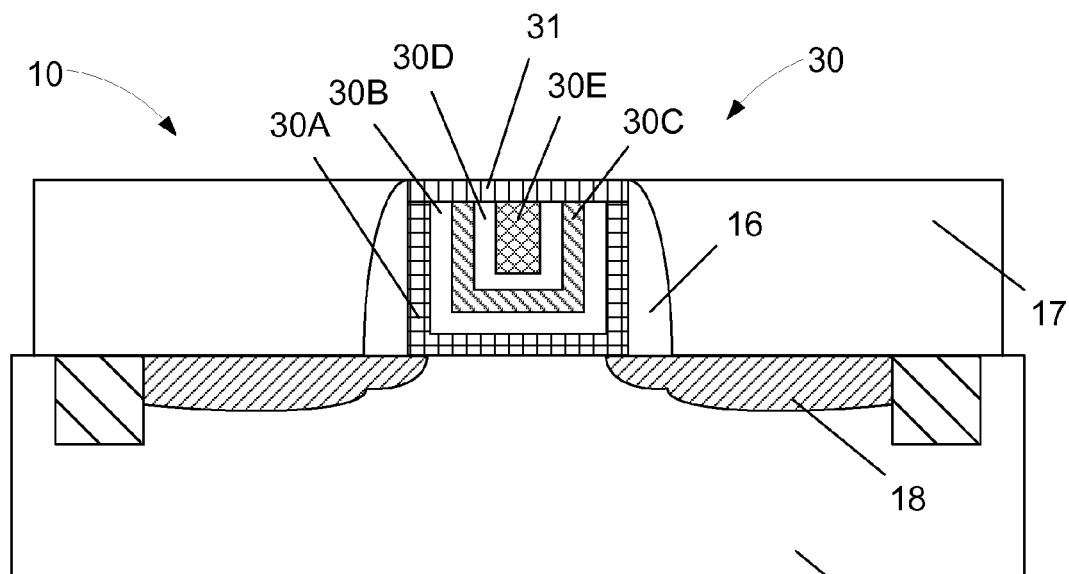
(Prior Art) Figure 1F

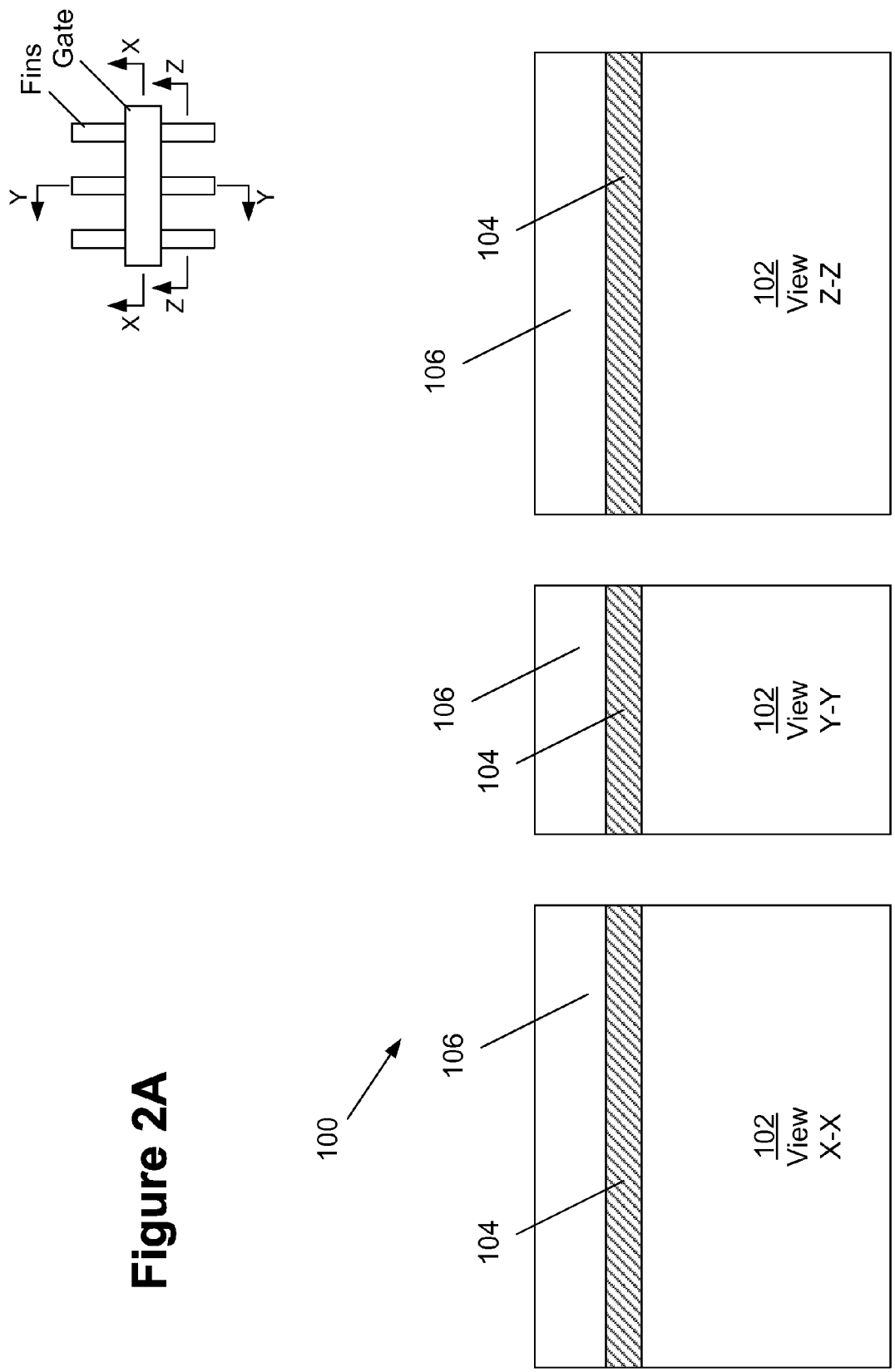

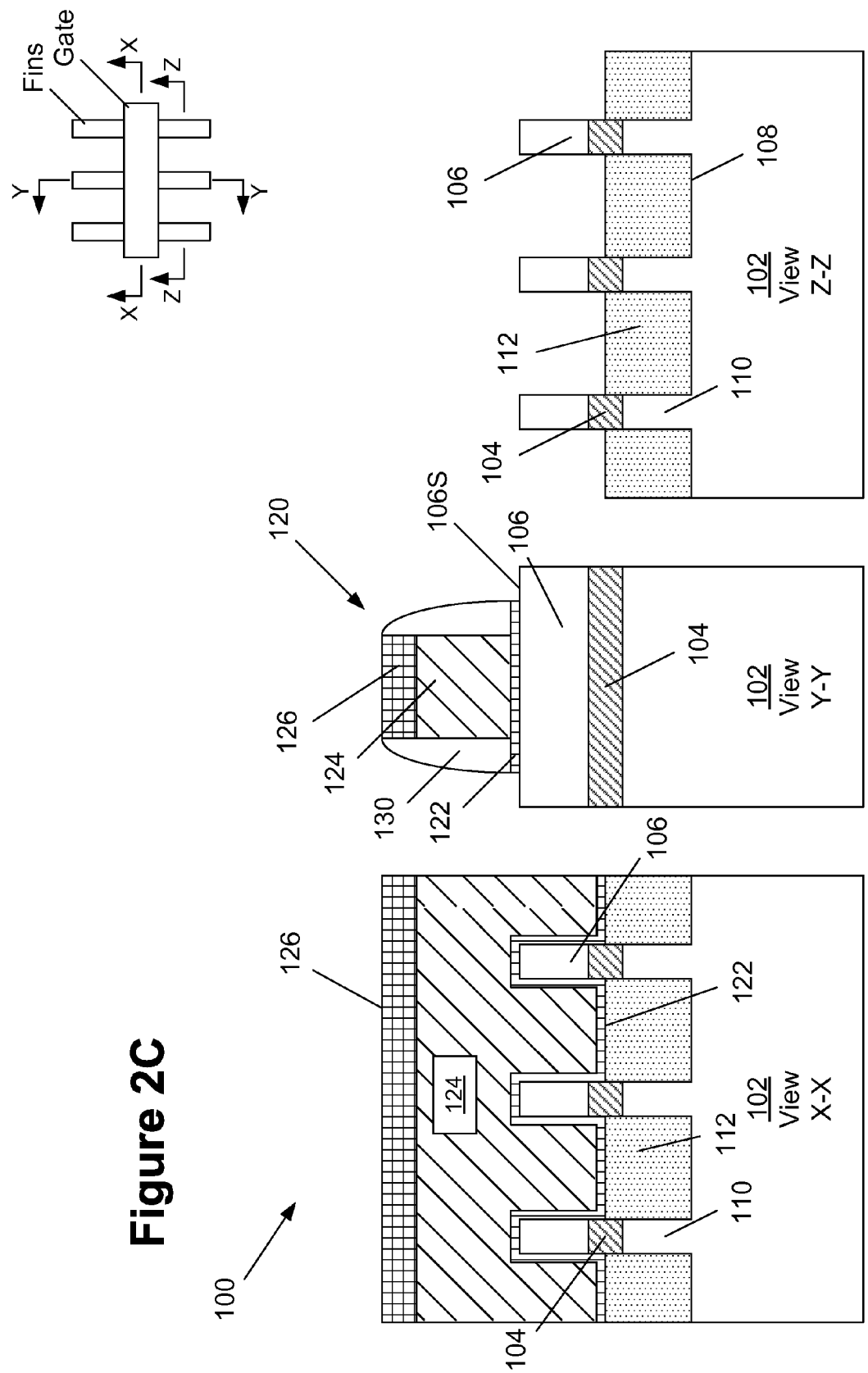

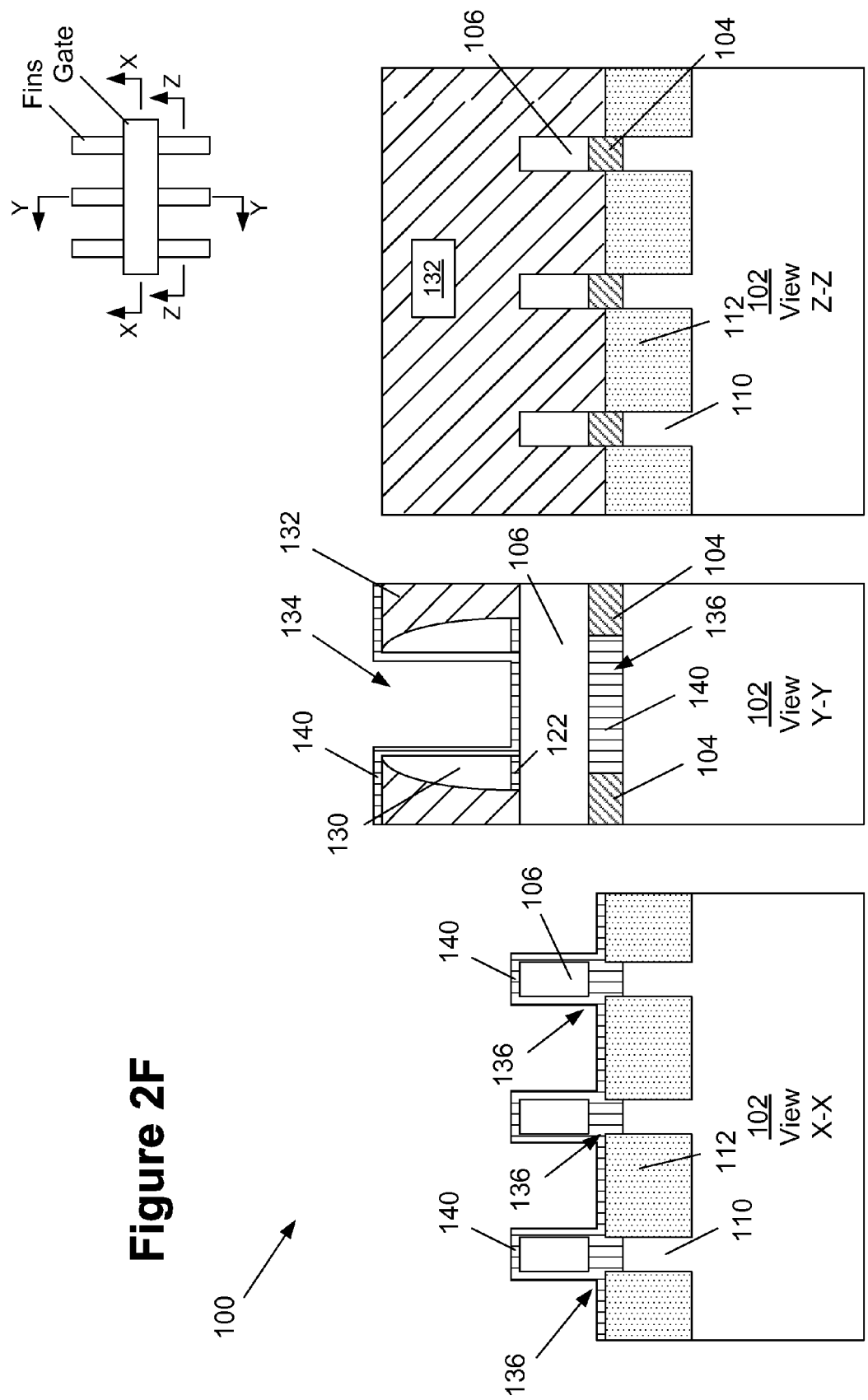

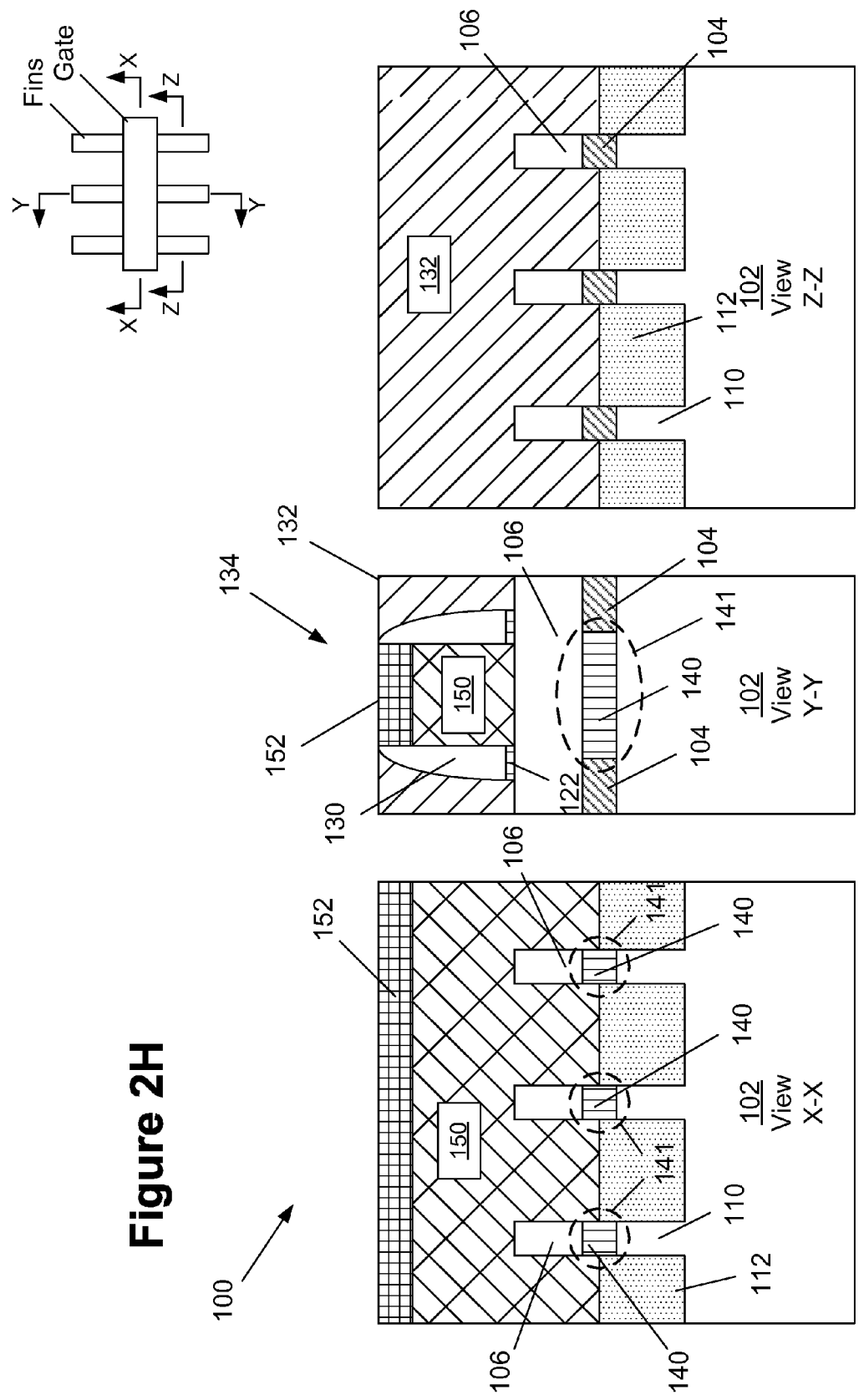

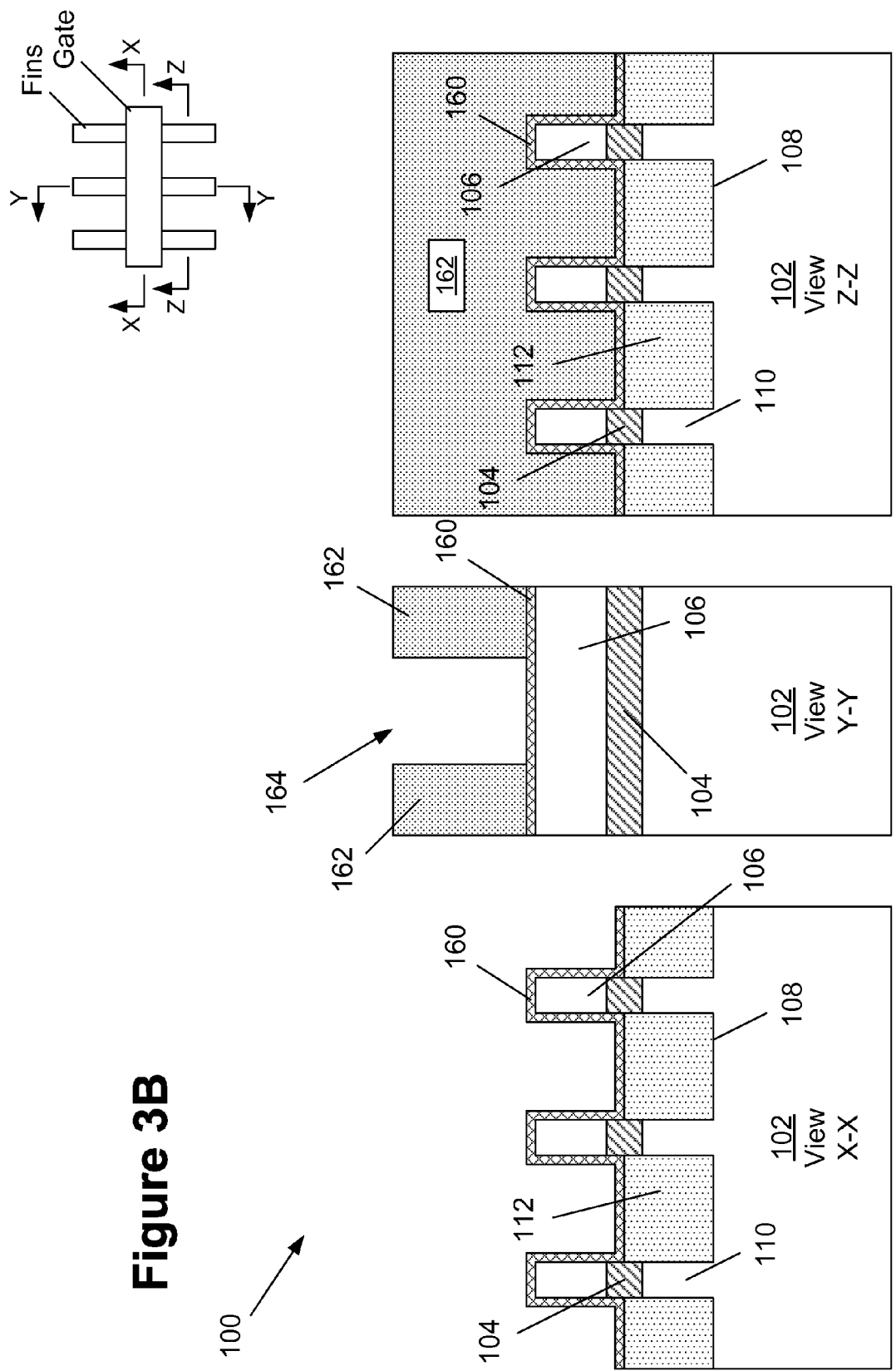

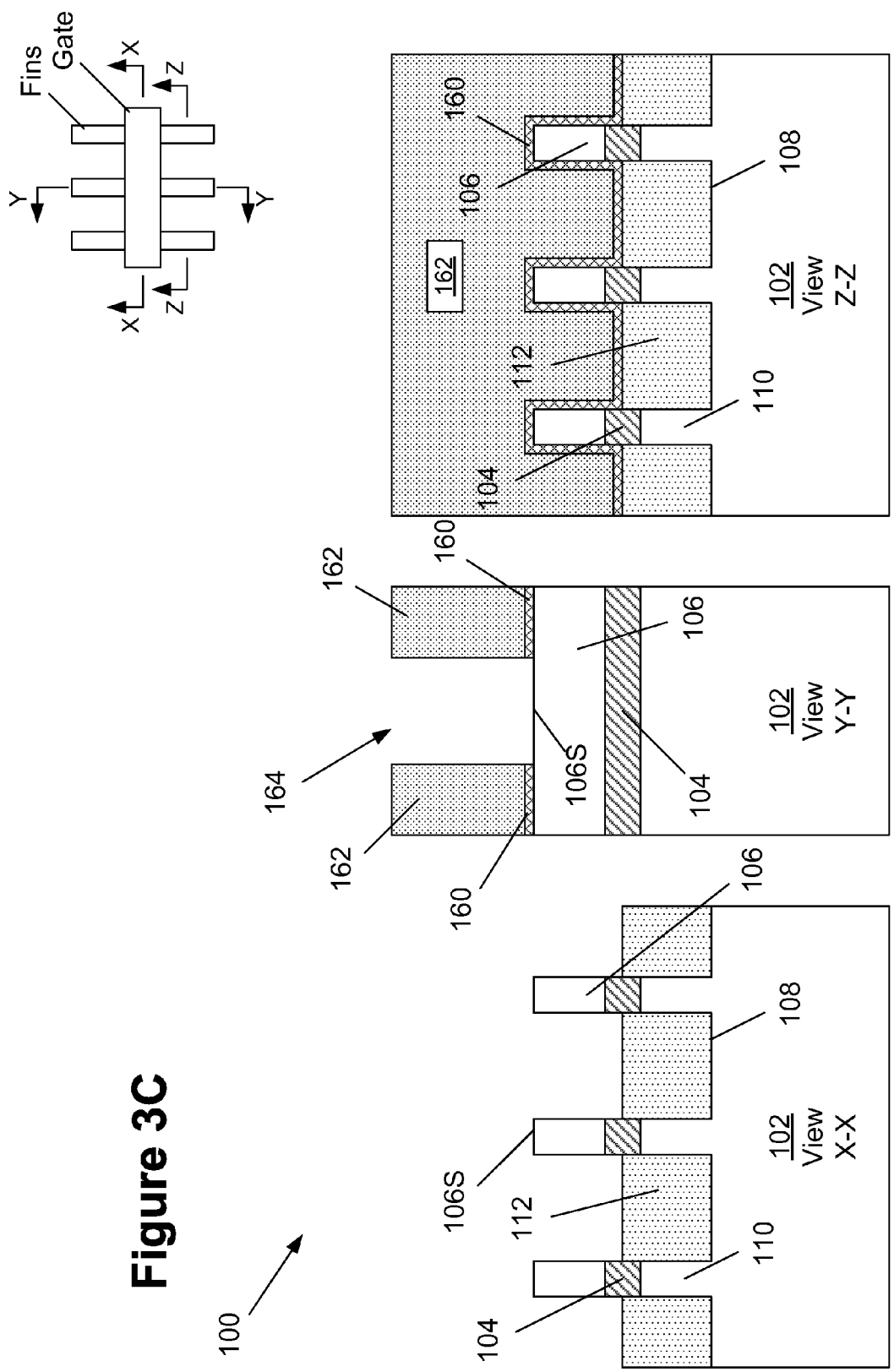

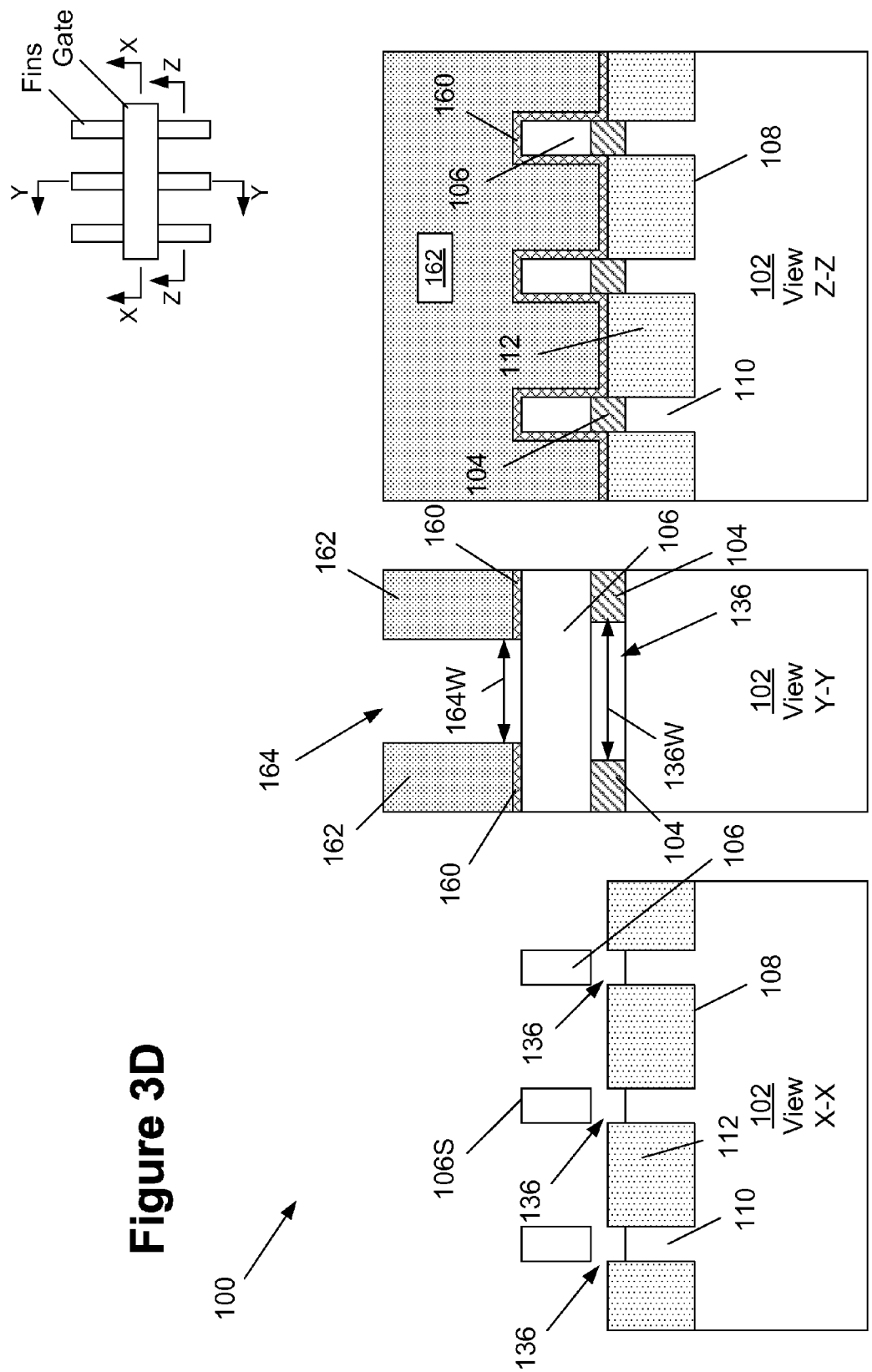

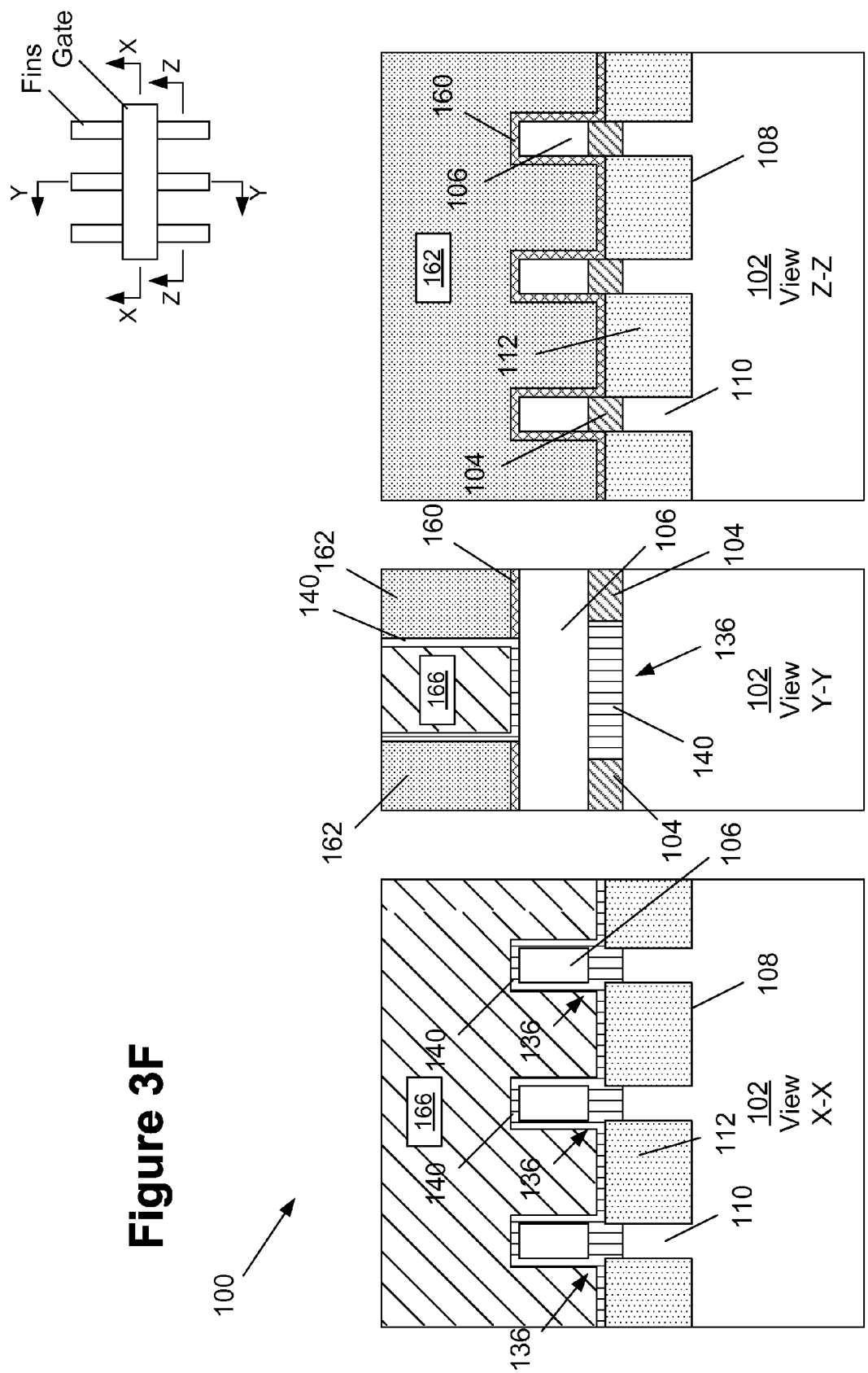

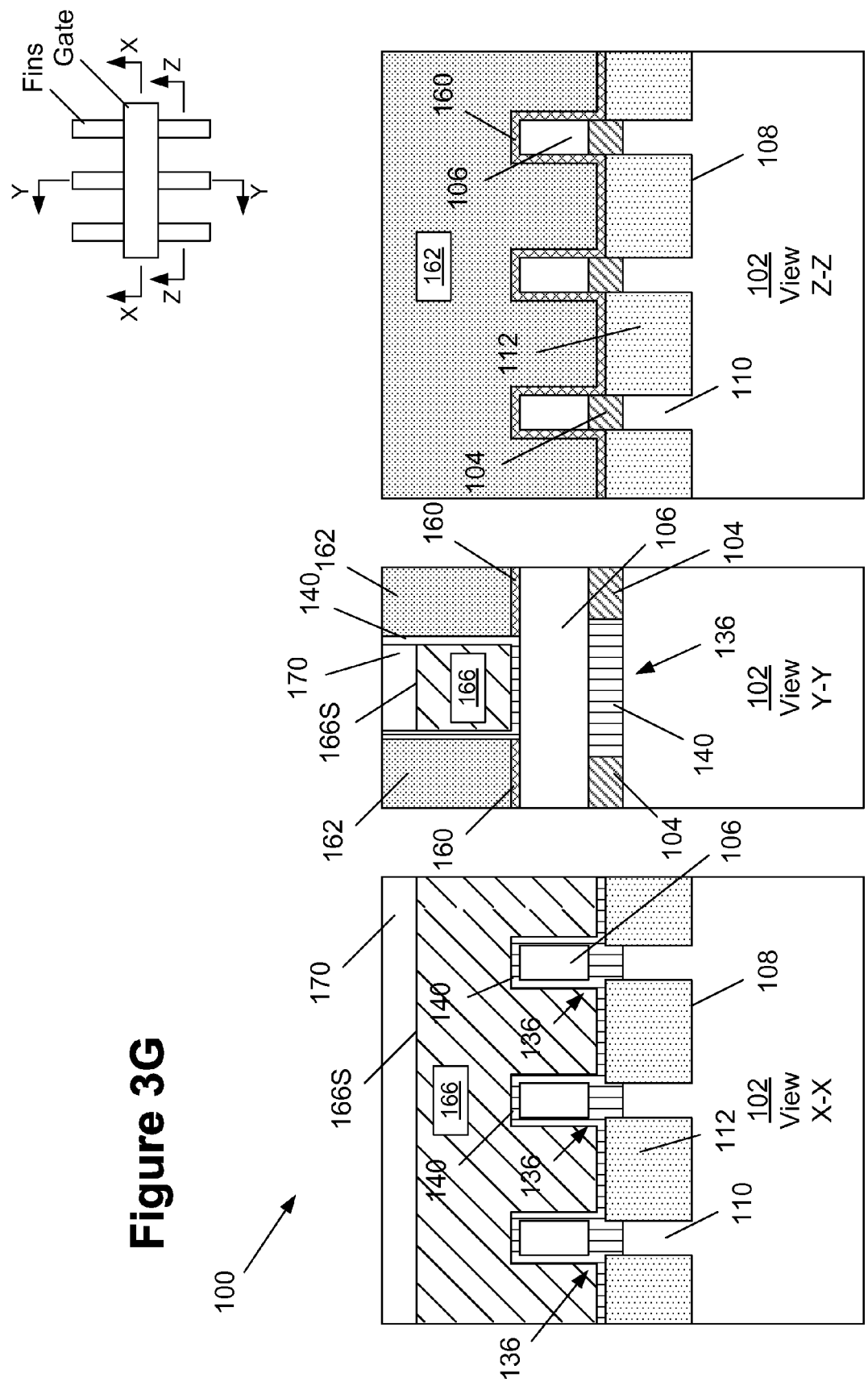

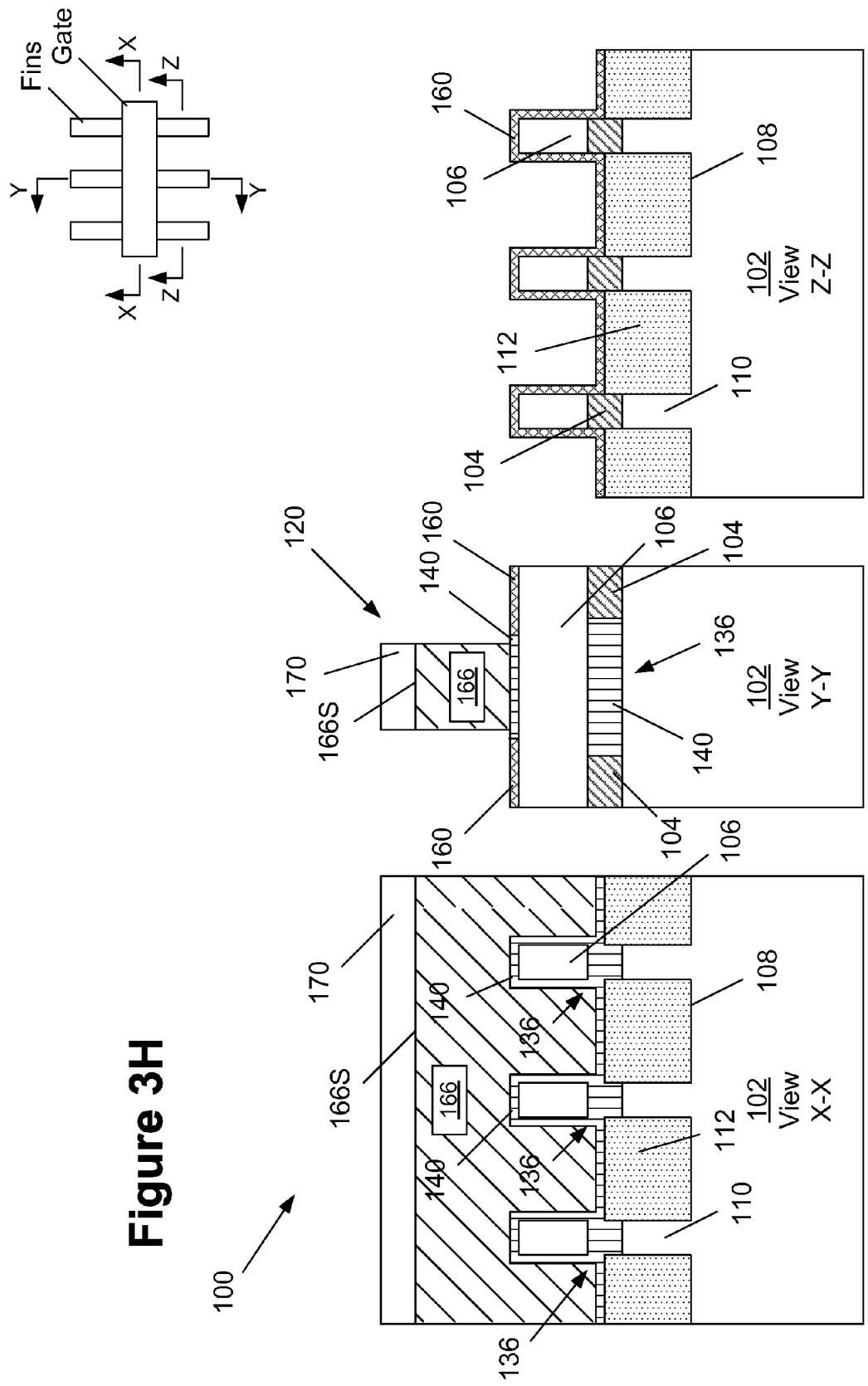

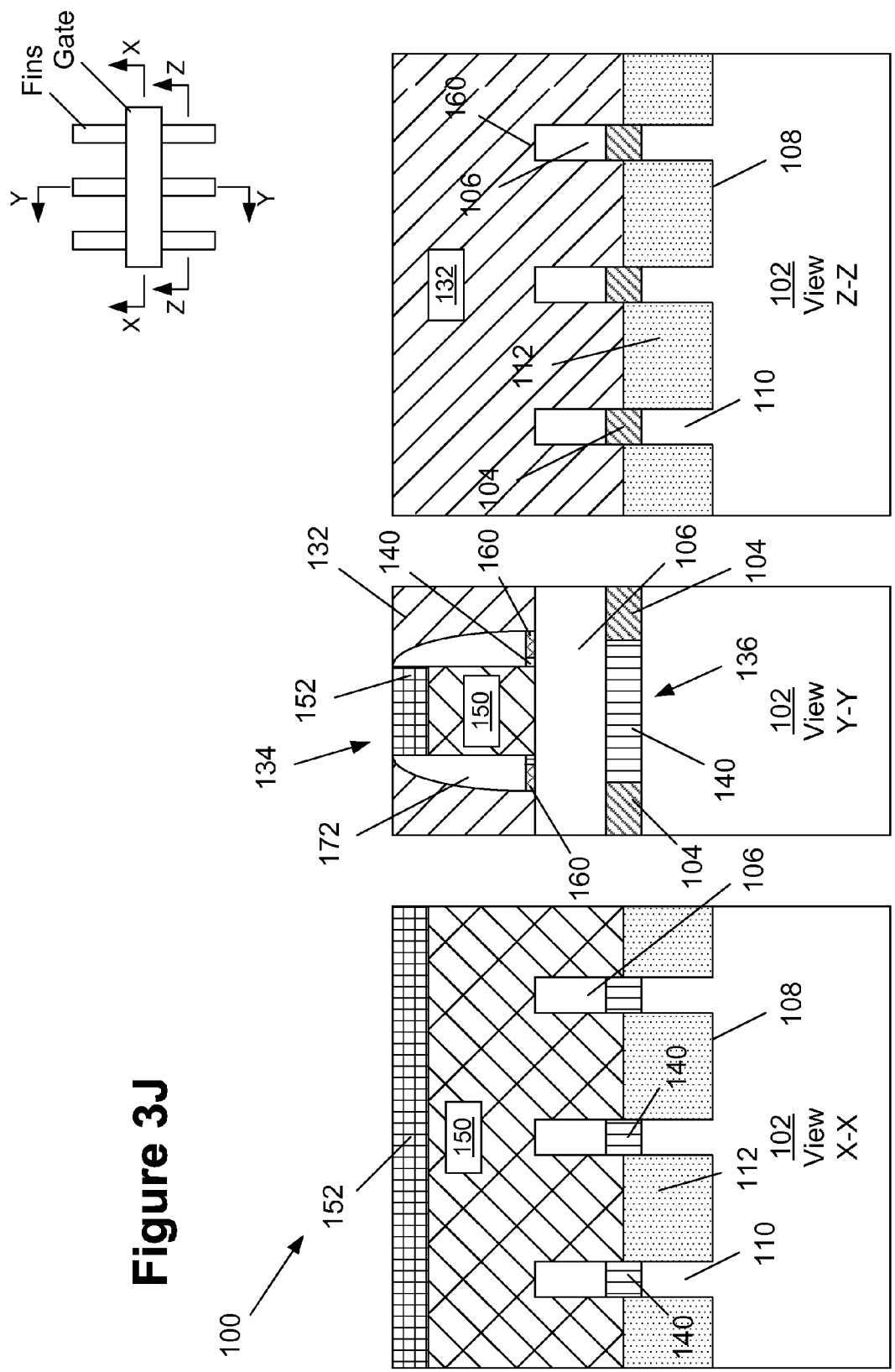

METHODS OF FORMING SUBSTANTIALLY SELF-ALIGNED ISOLATION REGIONS ON FINFET SEMICONDUCTOR DEVICES AND THE RESULTING DEVICES

CROSS-REFERENCE TO RELATED APPLICATION

This is a divisional of co-pending application Ser. No. 14/079,159, filed Nov. 13, 2013.

BACKGROUND OF THE INVENTION

1. Field of the Invention

The present disclosure generally relates to the fabrication of integrated circuits, and, more particularly, to various methods of forming substantially self-aligned isolation regions on FinFET semiconductor devices and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size.

In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond. The gate structures D for such FinFET devices may be manufactured using so-called "gate-first" or "replacement gate" (gate-last) manufacturing techniques.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1B-1E simplistically depict one illustrative prior art method for forming an HK/MG replacement gate structure using a replacement gate technique on a planar transistor device. As shown in FIG. 1B, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1B, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1C, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1D, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1E, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1F depicts the device 10 after several process operations were performed. First, one or more etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

One problem that is encountered in forming FinFET devices relates to preventing leakage currents underneath the fin structures. This is sometimes referred to as so-called "punch through" leakage currents. One prior art effort to eliminate or reduce such undesirable punch through leakage currents involved forming counter-doped regions that were positioned at approximately the intersection between the fin and the remaining portion of the substrate. However, obtaining an accurate doping profile that is properly positioned underneath the active FIN is very difficult to accomplish, especially given that the additional thermal heating processes that are involved in subsequent process steps will further drive dopant diffusion and make it harder to control the location of the anti-punch-through doping. If dopant diffuses into the FINs during subsequent annealing processes, it would cause threshold voltage fluctuation because of the random amount of the dopant diffused into FINs of different devices, which would severely compromise the circuit performance. Additionally, fabrication of FinFET devices may involve formation of stressed layers of insulation material in an effort to induce a desired stress on the channel region of the FinFET device, e.g., a tensile stress for N-type FinFET devices and a compressive stress for P-type FinFET devices. Such stressed channel regions are formed in an effort to improve the electrical performance characteristics of the N-type and P-type FinFET devices. Thus, an effort at reducing the undesirable punch through leakage currents must not unduly detract from the benefits achieved by virtue of the formation of the stressed materials that induce the desired stress in the channel region of the FinFET devices.

The present disclosure is directed to various methods of forming substantially self-aligned isolation regions on FinFET semiconductor devices, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming substantially self-aligned isolation regions on FinFET semiconductor devices, and the resulting semiconductor devices. One method disclosed includes, among other things, forming a first layer of a first semiconductor material on a semiconductor substrate, forming a second layer of a second semiconductor material on the first layer of the first semiconductor material, wherein the first layer of the first semiconductor material is selectively etchable relative to the semiconductor substrate and the second layer of the second semiconductor material, forming a plurality of spaced-apart trenches that extend at least partially into the semiconductor substrate, wherein the trenches define a fin structure comprised of the first and second layers of semiconductor material, and forming a sacrificial gate structure above a portion of the fin structure at a location that corresponds approximately to a location of the channel region for the device. In this example, the method further includes forming at least one sidewall spacer adjacent the sacrificial gate structure, performing at least one etching process to remove the sacrificial gate structure and thereby define a gate cavity, while masking portions of the fin structure positioned outside of the spacers, performing at least one selective etching process through the gate cavity to selectively remove a portion of the first layer of the first semiconductor material relative to the second layer of the second semiconductor material and the substrate so as to thereby define a space between the second semiconductor material and the semiconductor substrate, filling substantially all of the space between the second semiconductor material and the semiconductor substrate with an insulating material so as to thereby define a substantially self-aligned channel isolation region positioned under at least what will become the channel region of the device and, after forming the substantially self-aligned channel isolation region, forming a final gate structure in the gate cavity.

Another illustrative method disclosed herein includes, among other things, forming a first layer of a first semiconductor material on a semiconductor substrate, forming a second layer of a second semiconductor material on the first layer of the first semiconductor material, wherein the first layer of the first semiconductor material is selectively etchable relative to the semiconductor substrate and the second layer of the second semiconductor material, forming a plurality of spaced-apart trenches that extend at least partially into the semiconductor substrate, wherein the trenches define a fin structure for the device comprised of the first and second layers of semiconductor material, and forming a patterned layer of insulating material above the fin structure, wherein the patterned layer of insulating material has an opening at a location that corresponds approximately to a location of the channel region for the device. In this example, the method also includes, while masking portions of the fin structure with the patterned layer of insulating material, performing at least one selective etching process through the opening in the patterned layer of insulating material to selectively remove a portion of the first layer of the first semiconductor material relative to the second layer of the second semiconductor material and the substrate so as to thereby define a space between the second semiconductor material and the semiconductor substrate, filling substantially all of the space between the second semiconductor material and the semiconductor substrate with an insulating material so as to thereby define a substantially self-aligned channel isolation region positioned under at least what will become the channel region of the device, forming a sacrificial gate structure within the opening in the patterned layer of insulating material, removing the patterned layer of insulating material, forming at least one sidewall spacer adjacent the sacrificial gate structure, forming a layer of insulating material adjacent the sidewall spacer, performing at least one etching process to remove the sacrificial gate structure to thereby define a gate cavity, and forming a final gate structure in the gate cavity.

One illustrative device disclosed herein includes, among other things, a semiconductor substrate, a fin structure that is positioned vertically above the substrate, the fin structure being comprised of a first semiconductor material, spaced-apart portions of a second semiconductor material positioned vertically between the fin structure and the substrate, wherein the second semiconductor material is a different semiconductor material than the first semiconductor material, a local channel isolation material positioned laterally between the spaced-apart portions of the second semiconductor material and vertically below the fin structure, wherein the local channel isolation material is positioned under at least a portion of the channel region of the device, and a final gate structure positioned around the fin and above at least a portion of the local channel isolation material.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of one illustrative embodiment of a prior art FinFET device;

FIGS. 1B-1F depict one illustrative prior art method of forming a gate structure using a so-called "replacement gate" technique;

FIGS. 2A-2H depict one illustrative method disclosed for forming substantially self-aligned isolation regions on Fin-FET semiconductor devices, and the resulting semiconductor devices; and FIGS. 3A-3J depict another illustrative method disclosed for forming substantially self-aligned isolation regions on FinFET semiconductor devices, and the resulting semiconductor devices.

Figure 2B:
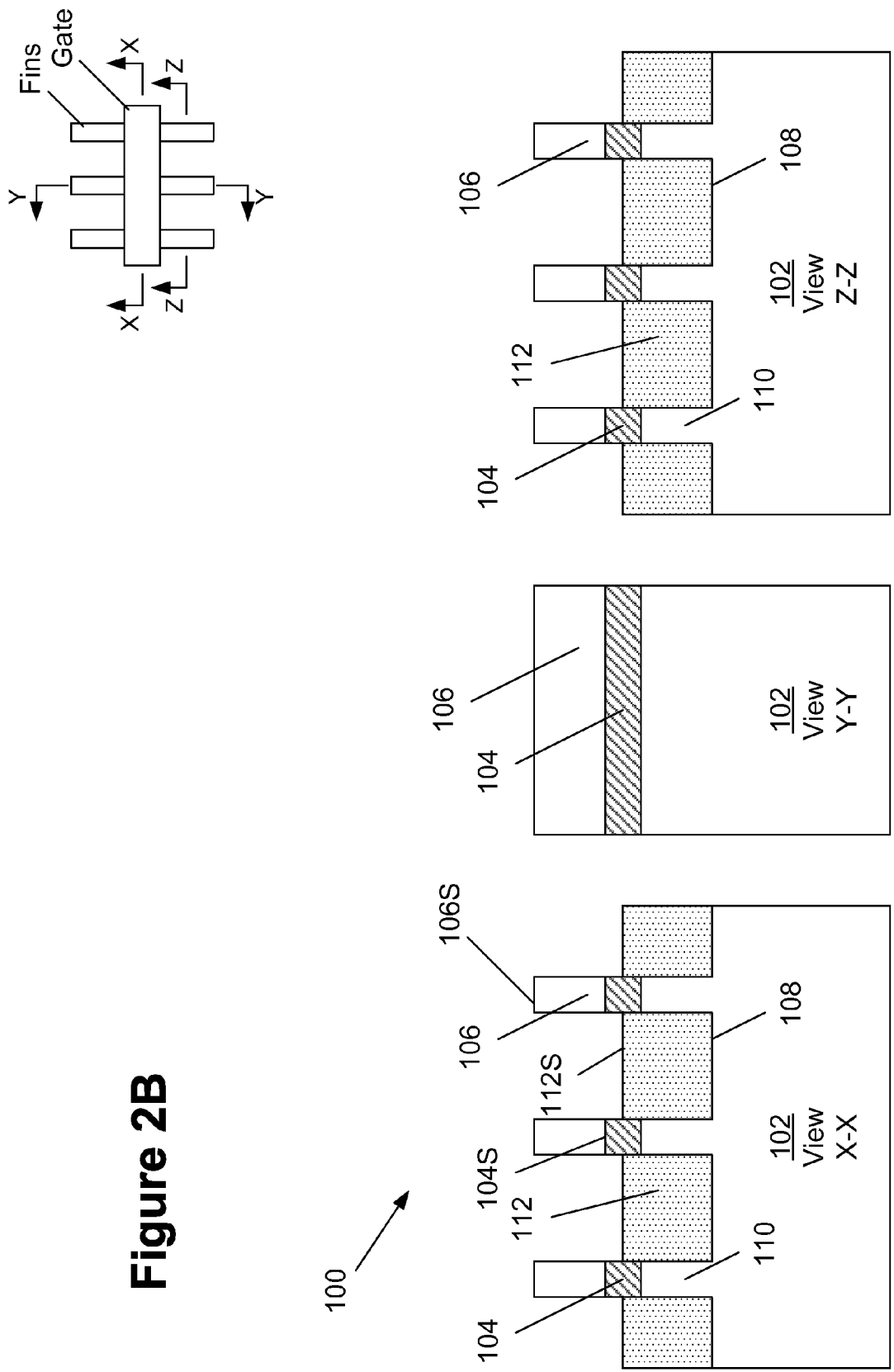

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming substantially self-aligned isolation regions on Fin-FET semiconductor devices, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

FIGS. 2A-2H depict one illustrative method disclosed for forming substantially self-aligned isolation regions on Fin-FET semiconductor devices, and the resulting semiconductor devices. The illustrative device 100 will be formed in and above the semiconductor substrate 102. The device 100 may be either an NMOS or a PMOS transistor. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials.

FIGS. 2A-2H present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is taken along the axial length of the gate electrode of the device (i.e., along the gate width direction of the device 100), the view "Y-Y" is a cross-sectional view that is taken through the long axis of a fin (i.e., in the current transport direction of the device), the view "Z-Z" is a cross-sectional view that is taken through the source/drain region of the device in a direction that is transverse to the long axis of the fins.

FIG. 2A depicts the device 100 at a point in fabrication wherein several process operations have been performed. First, a first layer of epi semiconductor material 104 is deposited on the surface of the semiconductor substrate 102. In one example, the layer of epi semiconductor material 104 may be a layer of silicon germanium ($Si_xGe_{1-x}$). The thickness of the epi semiconductor material 104 may vary depending upon the particular application. In one illustrative embodiment, the layer of epi semiconductor material 104 may have a thickness of about 5-15 nm. The epi semiconductor material 104 may be formed using any of a variety of different traditional epitaxial deposition processes. Thereafter, a second layer of epi semiconductor material 106 is deposited on the surface of the epi semiconductor material 104. In one example, the layer of epi semiconductor material 106 may be a layer of silicon. The thickness of the epi semiconductor material 106 may vary depending upon the particular application. In one illustrative embodiment, the layer of epi semiconductor material 106 may have a thickness of about 20-45 nm. The epi semiconductor material 106 may be formed using any of a variety of different traditional epitaxial deposition processes.

FIG. 2B depicts the device 100 after several process operations were performed. First, one or more etching processes were performed through a patterned etch mask (not shown) so as to define a plurality of trenches 108 in the substrate 102. This results in the formation of a plurality of substrate fins 110. During this process, the first layer of epi semiconductor material 104 and the second layer of epi semiconductor material 106 were also patterned so as to result in the structure depicted in FIG. 2B. The illustrative FinFET device 100 disclosed herein will be depicted as being comprised of three illustrative fins. However, as will be recognized by those skilled in the art after a complete reading of the present application, the methods and devices disclosed herein may be employed when manufacturing FinFET devices having any number of fins. The fins 110 extend laterally in the current transport direction and into what will become the source/drain regions of the device 100.

In one embodiment, the trenches 108 were formed by performing one or more etching processes through one or more patterned etch masks (not shown), e.g., a patterned hard mask layer, using known etching techniques. The patterned etch masks may be patterned using known sidewall image transfer techniques and/or photolithographic techniques, combined with performing known etching techniques. In some applications, a further etching process may be performed to reduce the width or to "thin" the fins, although such a thinning process is not depicted in the attached drawings. For purposes of this disclosure and the claims, the use of the terms "fin" or "fins" should be understood to refer to fins that have not been thinned as well as fins that have been subjected to such a thinning etch process. The device 100 may be electrically isolated from adjacent devices by one or more isolation regions (not shown) formed in the substrate 102.

With continuing reference to FIG. 2B, the overall size, shape and configuration of the trenches 108 and fins 110 may vary depending on the particular application. The depth and width of the trenches 108 may vary depending upon the particular application. In one illustrative embodiment, based on current day technology, the depth of the trenches 108 (below the upper surface 106S) may range from approximately 50-200 nm and the width of the trenches 108 may be about 15-60 nm. In some embodiments, the fins 110 may have a final width (at or near the bottom of the fin) within the range of about 5-20 nm. In the illustrative examples depicted in the attached figures, the trenches 108 and fins 110 are all of a uniform size and shape. However, such uniformity in the size and shape of the trenches 108 and the fins 110 is not required to practice at least some aspects of the inventions disclosed herein. In the example depicted herein, the trenches 108 are formed by performing an anisotropic etching process that results in the trenches 108 having a schematically depicted, generally rectangular configuration. In an actual real-world device, the sidewalls of the trenches 108 may be somewhat inwardly tapered, although that configuration is not depicted in the drawings. In some cases, the trenches 108 may have a reentrant profile near the bottom of the trenches 108. To the extent the trenches 108 are formed by performing a wet etching process, the trenches 108 may tend to have a more rounded configuration or non-linear configuration as compared to the generally rectangular configuration of the trenches 108 that are formed by performing an anisotropic etching process. Thus, the size and configuration of the trenches 108 and the fins 110, and the manner in which they are made, should not be considered a limitation of the present invention. For ease of disclosure, only the substantially rectangular trenches 108 and fins 110 will be depicted in subsequent drawings.

Also depicted in FIG. 2B is a layer of insulating material 112, e.g., silicon dioxide, that is formed between the fins 110 within the trenches 108. The insulating material 112 may be formed so as to exhibit a desired stress (e.g., tensile or compressive) or it may be formed in a substantially unstressed state. The layer of insulating material 112 depicted in FIG. 2B may be formed using a variety of techniques. In one illustrative process flow, the process flow for forming the layer of insulating material 112 includes the following steps: (1) perform the etching process(es) to etch through the first and second layers (106, 104) of the epi semiconductor material so as to form the trenches 108; (2) over-fill the trenches 108 with an insulating material (stressed or unstressed), e.g., such as silicon dioxide; (3) perform a CMP process on the layer of silicon dioxide that stops on the upper surface 106S of the fins 110; and (4) performing an etching process on the layer of insulating material 112 so as to recess the upper surface 112S of the layer of insulating material 112 to a desired height level. Importantly, the layer of insulating material 112 is recessed to the point that its upper recessed surface 112S is positioned at a level that is below a level of the upper surface 104S of the epi semiconductor material 104. In short, the layer of insulating material 112 is recessed to such an extent that at least a portion of the epi semiconductor material 104 is exposed. In one illustrative embodiment, the layer of insulating material 112 is recessed such that its upper surface 112S is positioned at least about 5 nm below the upper surface 104S of the epi semiconductor material 104.

In the example disclosed herein, the FinFET device 100 will be formed using a replacement gate technique. Accordingly, FIG. 2C depicts the device 100 at a point in fabrication wherein several process operations have been performed. More specifically, a sacrificial gate structure 120 has been formed above the substrate 102 and the fins 110. Also depicted is an illustrative gate cap layer 126 and sidewall spacers 130. The gate cap layer 126 and the sidewall spacers 130 are typically made of silicon nitride. The source/drain regions for the device are formed outside of the spacers 130, in the region depicted in view Z-Z. The source/drain regions may be formed by performing an in-situ doped epi process or by performing one or more conventional ion implantation processes. The epi material can be formed directly on the exposed fin or after the fin has been recessed (not shown). The epi material can be merged or unmerged. Such additional epi material is not depicted in the source/drain regions so as not to obscure aspects of the presently disclosed inventions. At this point in the replacement gate process flow, an anneal process would have already been performed to activate the implanted dopant materials and repair any damage to the substrate 102 due to the various ion implantation processes that were performed. The sacrificial gate structure 120 includes a sacrificial gate insulation layer 122 and a dummy or sacrificial gate electrode 124. The various components and structures of the device 100 may be formed using a variety of different materials and by performing a variety of known techniques. For example, the sacrificial gate insulation layer 122 may be comprised of silicon dioxide and the sacrificial gate electrode 124 may be comprised of polysilicon. The various layers of material depicted in FIG. 2C, as well as the layers of material described below, may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2D:
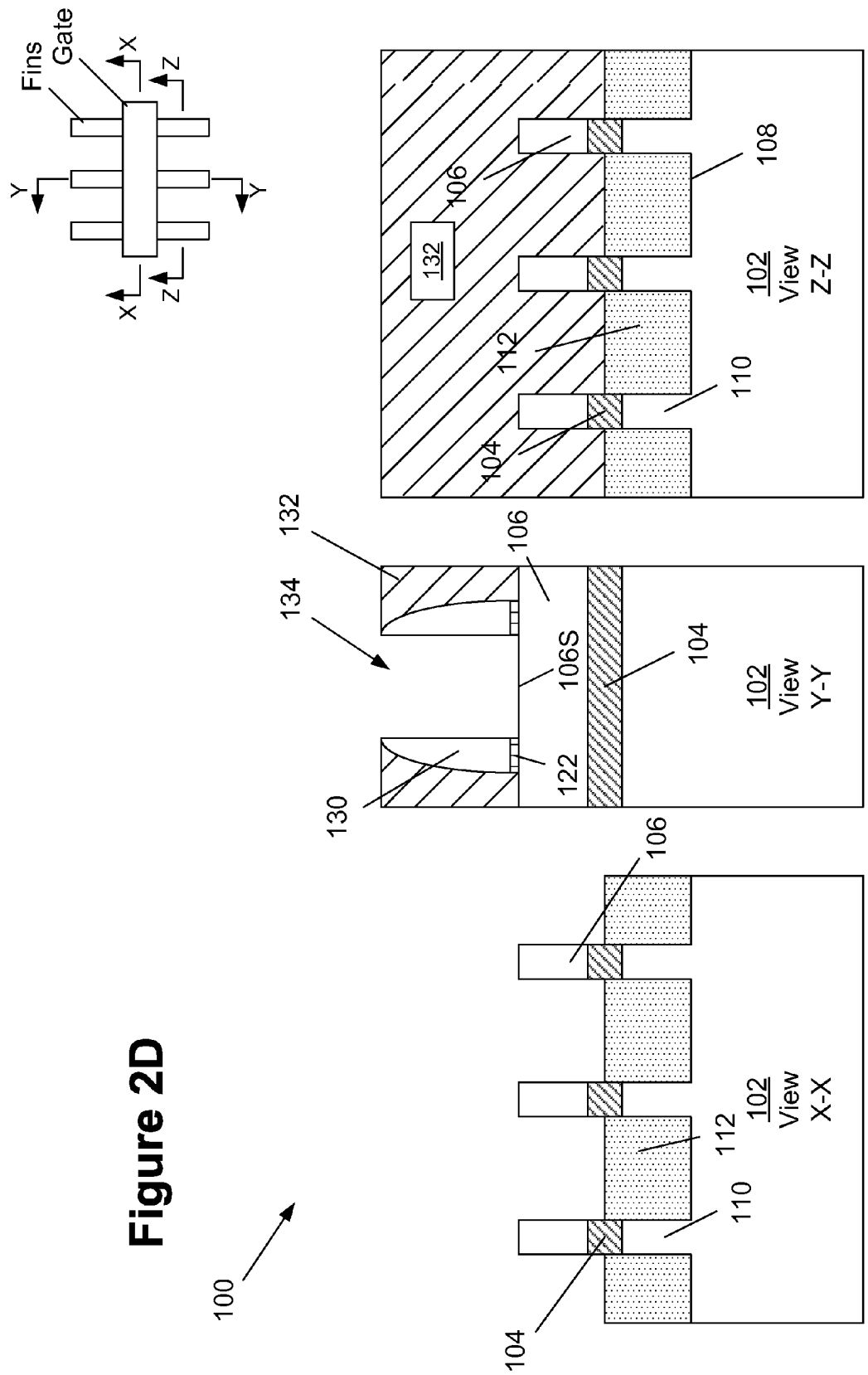

FIG. 2D depicts the device 100 after several process operations were performed.

First, a layer of insulating material 132 was deposited above the device 100 and a CMP process was then performed to planarize the upper surface of the layer of insulating material 132 with the upper surface of the gate cap layer 126 (see FIG. 2C). Thereafter, one or more wet or dry etching processes were performed to remove the gate cap layer 126, the sacrificial gate electrode 124 and the sacrificial gate insulation layer 122 to thereby define a gate cavity 134 where a replacement gate structure will subsequently be formed for the device 100.

Figure 2E:
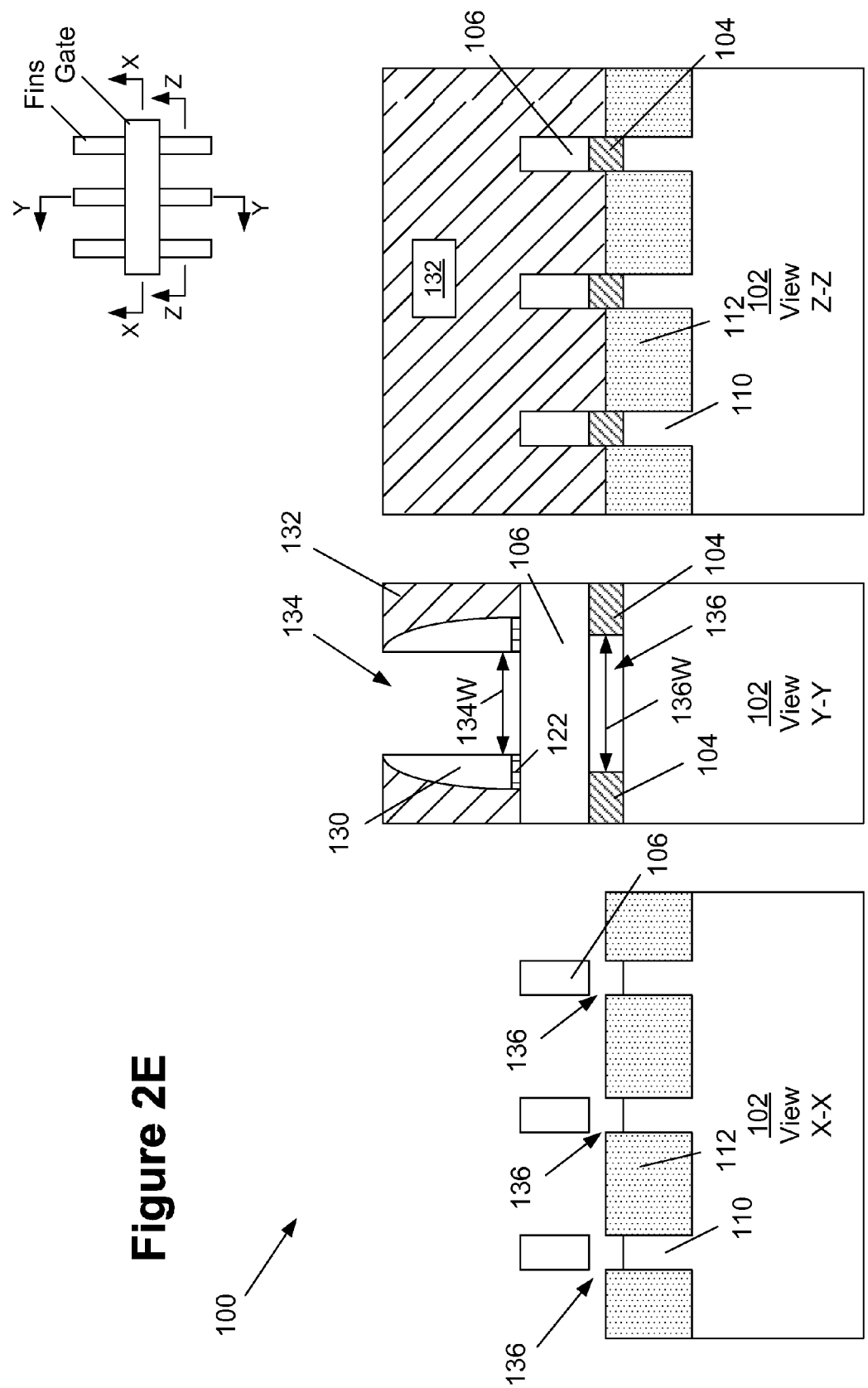

FIG. 2E depicts the device 100 after an etching process, such as an isotropic etching process, was performed to selectively remove the portions of the epi semiconductor material 104 exposed by the gate cavity 134 relative to the substrate 102 and the epi semiconductor material 106. As depicted in view Z-Z, in one illustrative embodiment, the epi semiconductor material 104 positioned outside of the spacers 130 (i.e., in the source/drain regions of the device 100) is protected during this etching process by the layer of insulating material 132, and thus is not removed. This etching process results in the formation of a substantially self-aligned space 136 (relative to the gate cavity 134) for an isolation material to be positioned under what will become the channel region for the device 100. In one embodiment, the space 136 has a lateral width 136W (in the current transport or gate length direction) that is slightly larger than the lateral width 134W of the gate cavity 134. As noted above, in one embodiment, the epi semiconductor material 104 is not removed in areas outside of the spacers 130, i.e., the material 104 is not removed in the source/drain regions of the device 100.

Next, as shown in FIG. 2F, a conformal deposition process was performed so as to form a layer of insulating material 140, e.g., silicon dioxide so as to substantially fill the space 136 that is substantially aligned with the gate cavity 134. In one embodiment, this process operation involves depositing the layer of insulating material 140 with a thickness of about half of the space 136, followed by isotropically etching back the layer of insulating material 140 with a target removal amount being approximately equal to the initially deposited thickness of the layer of insulating material 140, as described more fully below.

Figure 2G:
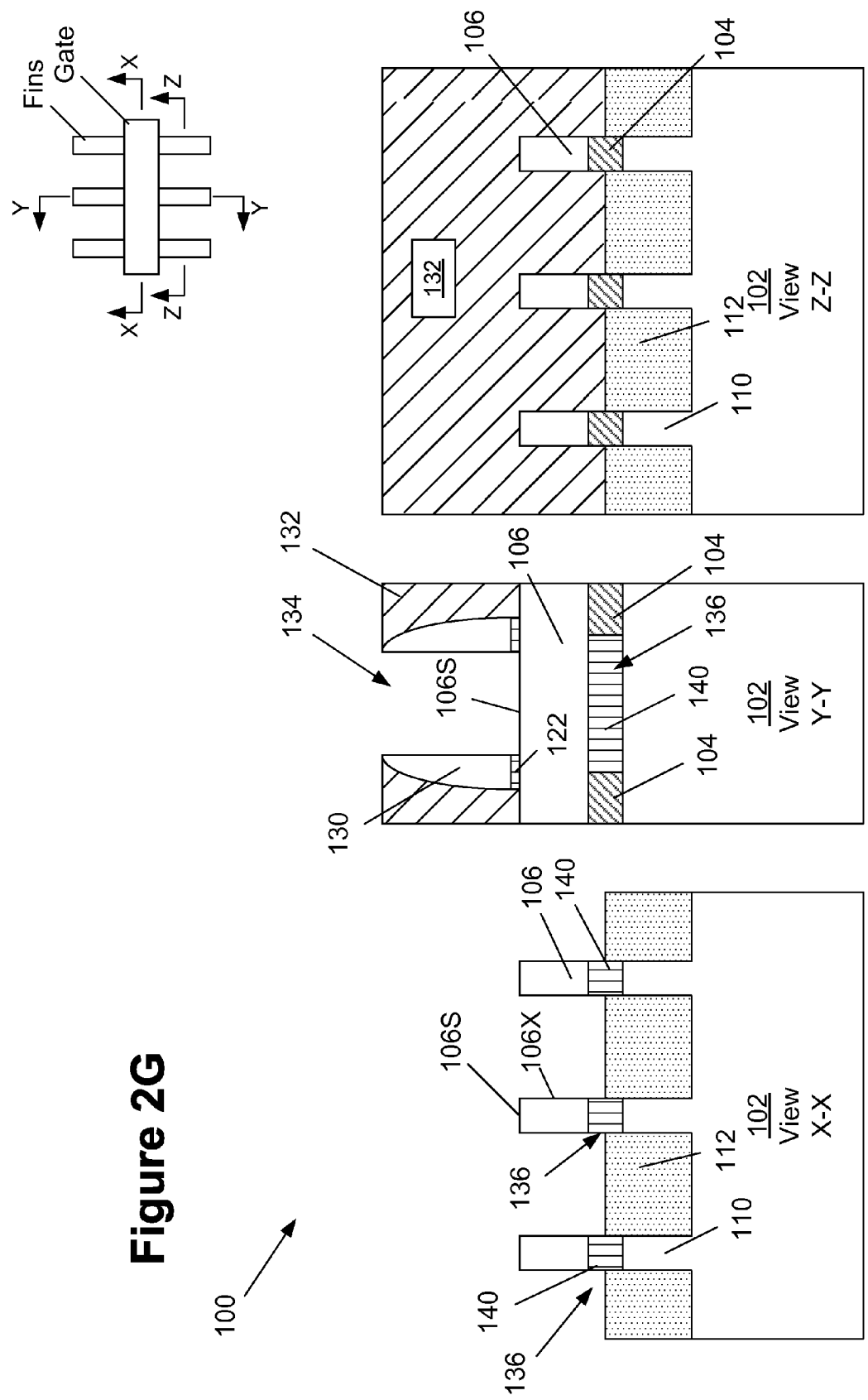

FIG. 2G depicts the device 100 after an etch-back process, such as an isotropic etch-back process, was performed so as to remove portions of the layer of insulating material 140. This etching process also removes portions of the layer of insulating material 140 from the sidewalls 106X and upper surface 106S of the fins 110 within the gate cavity 134. This process operation results in the formation of the substantially self-aligned channel isolation region 140 that is positioned under at least the channel region of the device 100. In one embodiment, the lateral width 136W (see FIG. 2E) of the channel material 140 is larger than the lateral width of the final gate structure for the device, which corresponds approximately to the width 134W (see FIG. 2E) at a point just above the upper surface 106S of the fins 110.

Thereafter, several known processing operations were performed to form a schematically depicted replacement gate structure 150 in the gate cavity 134, as depicted in FIG. 2H. The replacement gate structure 150 depicted herein is intended to be representative in nature of any type of gate structure that may be employed in manufacturing integrated circuit products using so-called gate-last (replacement gate) manufacturing techniques. The replacement gate structure 150 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum. Typically, the various layers of material that will be present in the replacement gate structure 150 are sequentially deposited in the gate cavity 134 and above the layer of insulating material 132 and one or more CMP processes are performed to remove excess portions of the gate materials positioned outside of the gate cavity 134, as described in the background section of this application. Then, one or more etching processes were performed to remove upper portions of the various materials within the cavity 134 so as to form the replacement gate structure 150 and to form a recess above the replacement gate structure 150. Then, a gate cap layer 152 was formed in the recess above the recessed gate materials. The gate cap layer 152 is typically comprised of silicon nitride and it may be formed by depositing a layer of gate cap material so as to over-fill the recess formed in the gate cavity 134 above the replacement gate structure 150 and thereafter performing a CMP process to remove excess portions of the gate cap material layer 152 positioned above the surface of the layer of insulating material 132. The gate cap layer 152 is formed so as to protect the underlying gate materials during subsequent processing operations.

As will be appreciated by those skilled in the art after a complete reading of the present application, the FinFET device 100 depicted in FIG. 2H has a unique structure and provides unique benefits relative to prior art FinFET devices. More specifically, positioning of the local, substantially self-aligned channel isolation material 140 (enclosed by dashed lines 141) under all or a substantial portion of the channel region of the device 100 may result in better electrical performance of the device 100, e.g., the reduction or elimination of undesirable punch through currents, without causing any substantial threshold voltage fluctuation due to random dopant diffusion. As noted above, in one embodiment, the substantially self-aligned channel isolation material 140 has a lateral width (in the current transport direction) that is wider than the replacement gate structure 150 and the channel region of the device 100. Moreover, using the novel process flow depicted herein, the epi semiconductor material 104 may still remain positioned between the substrate 102 and the epi semiconductor material 106 in the source/drain regions laterally outside of the spacers 130 (see view Z-Z in FIG. 2H). Of course, if desired, a process flow may be adopted in which the epi semiconductor material 104 positioned outside of the spacers 130 is substantially consumed or replaced, e.g., by forming inverted or embedded source/drain regions for the device 100 using well known techniques.

Figure 3A:
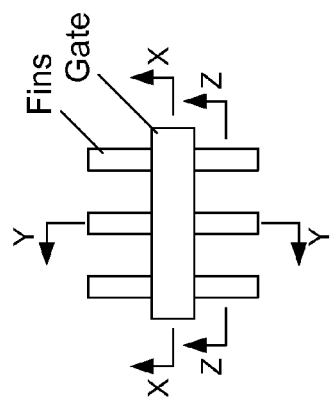
Figure 3A:
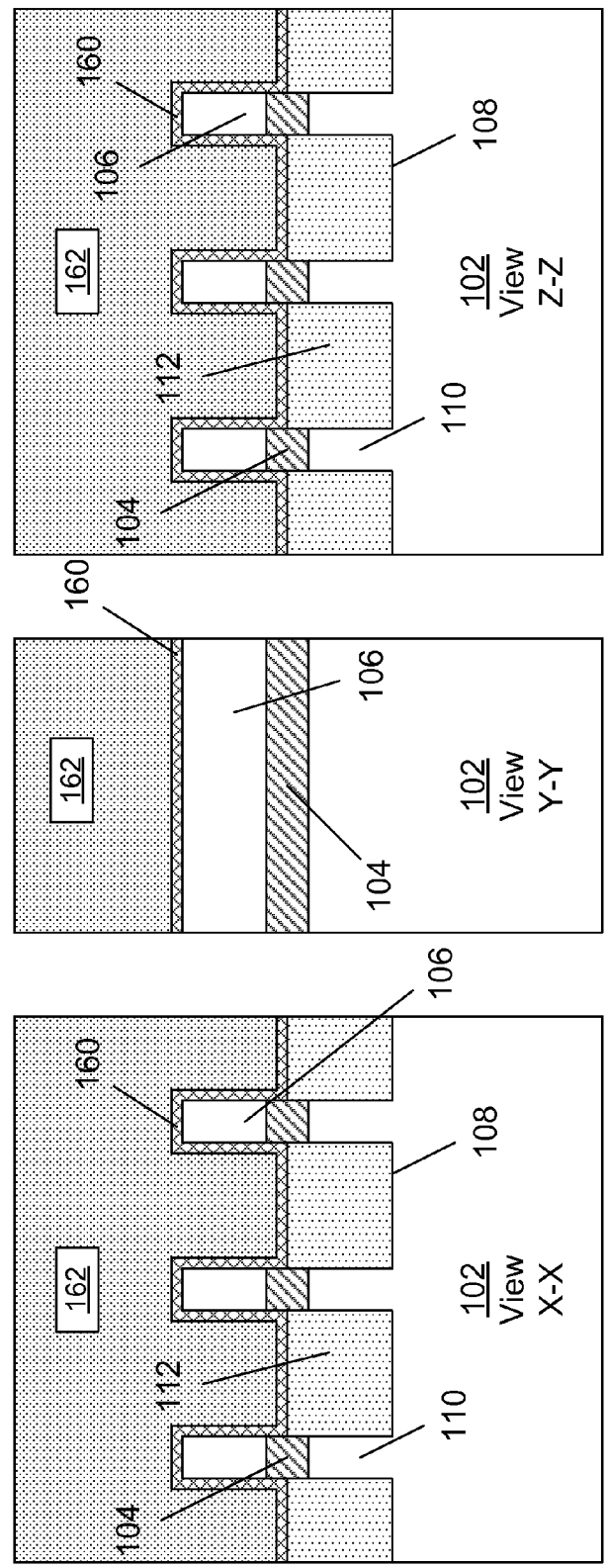

FIGS. 3A-3J depict another illustrative method disclosed for forming substantially self-aligned isolation regions on FinFET semiconductor devices, and the resulting semiconductor device. In this embodiment, relative to the embodiment shown in FIGS. 2A-2H, the substantially self-aligned channel isolation region 140 is formed prior to the formation of the sacrificial gate structure 120. FIG. 3A depicts the device 100 at a point in fabrication that corresponds to that depicted in FIG. 2B, i.e., after the trenches 108 were formed in the substrate 102 so as to define the substrate fins 110, and after the layer of insulating material 112 was formed between the fins 110 within the trenches 108. Also depicted in FIG. 3A is a liner 160, such as a silicon nitride liner, and a layer of insulating material 162, such as a layer of silicon dioxide. The liner 160 may be of any desired thickness and it may be formed by performing a conformal deposition process. The layer of insulating material 162 may likewise be formed to any desired thickness and it may be formed by performing a CVD process. FIG. 3A depicts the device after the upper surface of the layer of insulating material 162 has been planarized by performing a CMP process.

FIG. 3B depicts the device 100 after the layer of insulating material 162 has been patterned to define an opening 164 above a region where the gate structure for the device 100 will ultimately be formed. The opening 164 may be formed by forming a patterned etch mask (not shown), e.g., a patterned layer of photoresist, above the layer of insulating material 162 and thereafter performing an anisotropic etching process using the liner layer 160 as an etch-stop layer.

FIG. 3C depicts the device 100 after an etching process was performed to remove the portions of the liner layer 162 exposed by the opening 164. This etching process exposes the upper surface 106S within the opening 164.

FIG. 3D depicts the device 100 after an etching process, such as an isotropic etching process, was performed to selectively remove the portions of the epi semiconductor material 104 exposed by the gate cavity 164 relative to the substrate 102 and the epi semiconductor material 106. As depicted, in one illustrative embodiment, the epi semiconductor material 104 positioned in the source/drain regions of the device 100 (see views Y-Y and Z-Z) is protected during this etching process by the layer of insulating material 162, and thus is not removed. This etching process results in the formation of a substantially self-aligned space 136 (relative to the opening 164) positioned under what will become the channel region for the device 100. In one embodiment, the space 136 has a lateral width 136W that is slightly larger than the lateral width 164W of the opening 164. As noted above, in one embodiment, the epi semiconductor material 104 is not removed in the source/drain regions of the device 100.

Figure 3E:
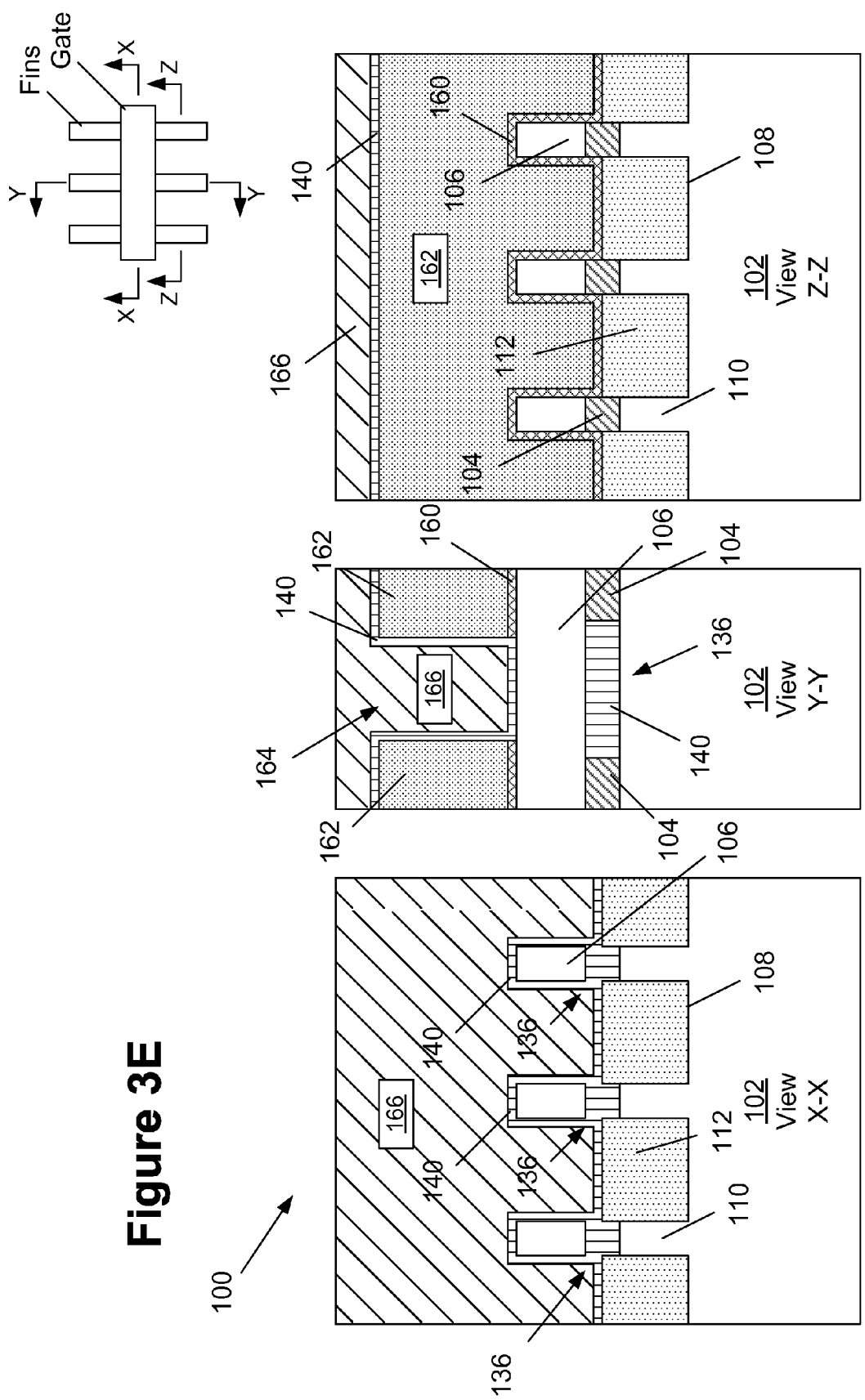

Next, as shown in FIG. 3E, a conformal deposition process was performed so as to form the above-described layer of insulating material 140, e.g., silicon dioxide, such that it substantially fills the space 136 that is substantially aligned with the opening 164. In the embodiment depicted in FIGS. 3A-3J, the layer of insulating material 140 will also serve as the sacrificial gate insulation layer for the sacrificial gate structure 120 that will be formed for the device 100. Also depicted in FIG. 3E is a layer of sacrificial gate material 166, e.g., polysilicon, that has been deposited across the device and in the opening 164. As noted above, the layer of insulating material 140 may be initially deposited with a thickness of about half of the space 136 so as to reliably fill the space 136.

FIG. 3F depicts the device 100 after one or more CMP processes have been performed to remove materials positioned above the upper surface of the layer of insulating material 162.

FIG. 3G depicts the device 100 at a point in fabrication wherein several process operations have been performed. First one or more etch-back processes were performed on the sacrificial gate material 166 such that its upper surface 166S is recessed to make room for the depicted gate cap layer 170. The gate cap layer 170 may be formed by depositing a layer of gate cap material and thereafter performing a CMP process to remove excess materials positioned above the layer of insulating material 162.

FIG. 3H depicts the device 100 after one or more etching processes are performed to remove the exposed portions of the layer of insulating material 140 and the layer of insulating material 162. This etching process stops on the liner layer 160. As will be appreciated by those skilled in the art, in this embodiment, the sacrificial gate structure 120 is comprised of the remaining portions of the layer of insulating material 140 and the layer of sacrificial gate material 166. The depicted gate cap layer 170 is positioned above the sacrificial gate structure 120 shown in FIG. 3H.

Figure 3I:
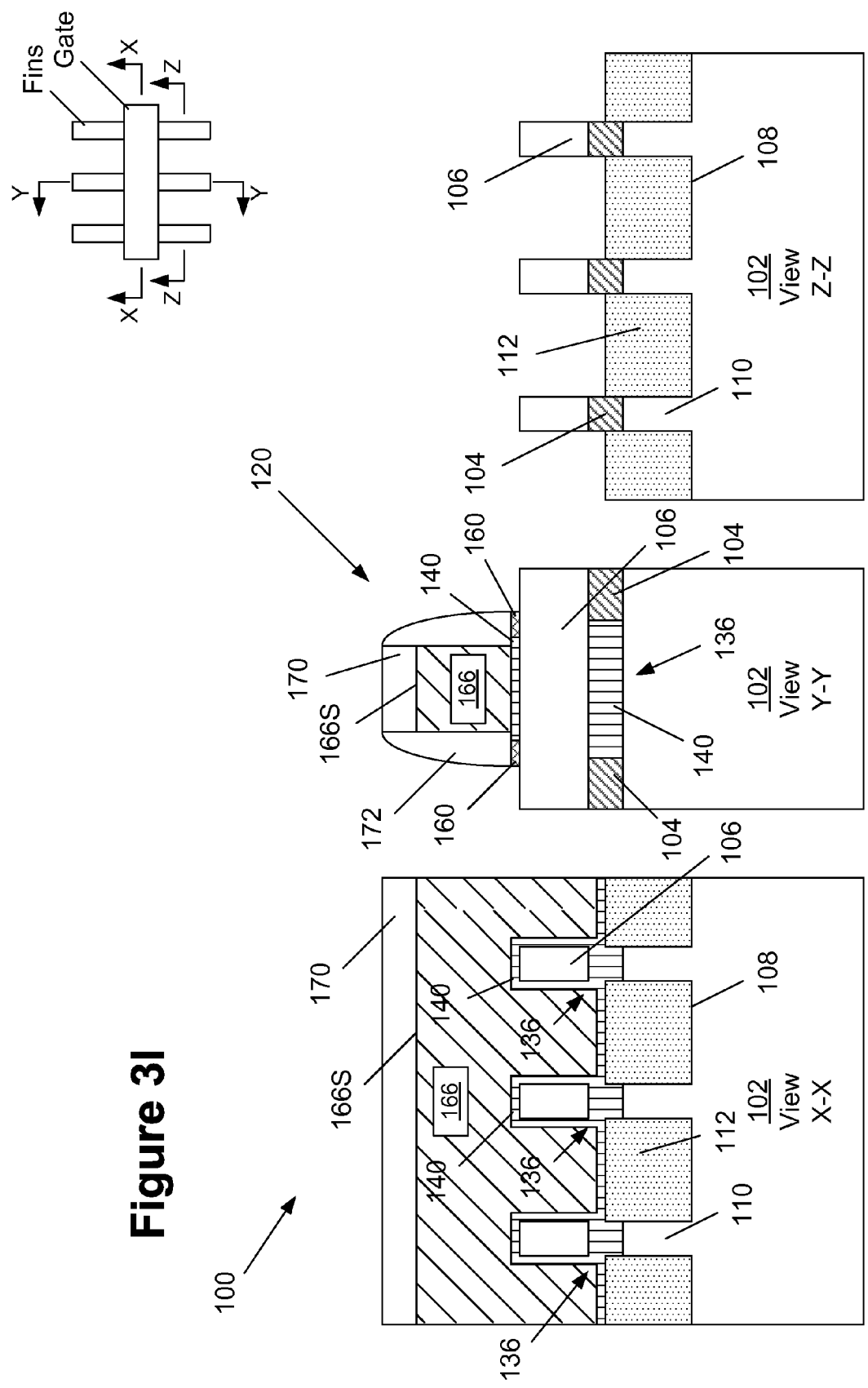

FIG. 3I depicts the device 100 at a point in fabrication wherein several process operations have been performed. More specifically, sidewall spacers 172 have been formed adjacent the sacrificial gate structure 120. The sidewall spacers 172 are typically made of silicon nitride. The spacers 172 may be formed by depositing a layer of spacer material and performing an anisotropic etching process. In the case where the liner layer 160 and the spacers 172 are made of the same material, the exposed portions of the liner layer 160 may also be removed when the spacers are formed. Alternatively, after the spacers 172 are formed, the exposed portions of the liner layer 160 may be removed by performing another etching process. Thereafter, source/drain regions for the device may be formed. However, as noted above, any epi material that may have been formed in the source/drain regions of the device is not depicted in the drawings.

FIG. 3J depicts the device 100 after several process operations were performed. First, the above-described layer of insulating material 132 was formed above the device 100 and planarized so as to expose the gate cap layer 170 (see FIG. 3I). Thereafter, one or more wet or dry etching processes were performed to remove the gate cap layer 170, the sacrificial gate material 166 and the layer of insulating material 140 to thereby define a gate cavity 134 where the above-described replacement gate structure 150 and gate cap layer 152 are formed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Note that the use of terms, such as "first," "second," "third" or "fourth," to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming a FinFET device comprising a channel region and a plurality of source/drain regions, the method comprising:

forming a first layer of a first semiconductor material on a semiconductor substrate;

forming a second layer of a second semiconductor material on said first layer of said first semiconductor material, wherein said first layer of said first semiconductor material is selectively etchable relative to said semiconductor substrate and said second layer of said second semiconductor material;

forming a plurality of spaced-apart trenches that extend at least partially into said semiconductor substrate, said trenches defining a fin structure for said device comprised of said first and second layers of semiconductor material, said fin structure extending in a gate-length direction across what will become said channel region and said source/drain regions for said device;

forming a patterned layer of insulating material above said fin structure, said patterned layer of insulating material having an opening at a location that corresponds approximately to a location of said channel region for said FinFET device;

while masking portions of said fin structure with said patterned layer of insulating material, performing at least one selective etching process through said opening in said patterned layer of insulating material to selectively remove a portion of said first layer of said first semiconductor material relative to said second layer of said second semiconductor material and said substrate so as to thereby define a space between said second semiconductor material and said semiconductor substrate;

filling substantially all of said space between said second semiconductor material and said semiconductor substrate with an insulating material so as to thereby define a substantially self-aligned channel isolation region positioned under at least what will become said channel region of said device;

after filling substantially all of said space with said insulating material, forming a sacrificial gate structure within said opening in said patterned layer of insulating material;

removing said patterned layer of insulating material;

forming at least one sidewall spacer adjacent said sacrificial gate structure;

forming a layer of insulating material adjacent said sidewall spacer;

performing at least one etching process to remove said sacrificial gate structure to thereby define a gate cavity; and forming a final gate structure in said gate cavity.

2. The method of claim 1, wherein said semiconductor substrate and said second layer of said second semiconductor material are silicon and said first layer of said first semiconductor material is silicon/germanium ($Si_xGe_{1-x}$).

3. The method of claim 1, wherein said semiconductor substrate and said second layer of said second semiconductor material are comprised of the same material.

4. The method of claim 1, wherein performing said at least one selective etching process through said opening in said patterned layer of insulating material comprises performing an isotropic etching process through said opening in said patterned layer of insulating material.

5. The method of claim 1, wherein filling substantially all of said space between said second semiconductor material and said semiconductor substrate with said insulating material comprises performing a conformal deposition process to fill substantially all of said space between said second semiconductor material and said substrate with silicon dioxide by depositing a layer of silicon dioxide with a thickness that is about one-half of a vertical thickness of said space.

6. The method of claim 1, wherein, prior to forming said patterned layer of insulating material, forming a stress-inducing insulating material in said trenches so as to induce one of a tensile stress or a compressive stress on said fin structure.

7. The method of claim 1, wherein, prior to forming said patterned layer of insulating material, forming an insulating material in said trenches and recessing said layer of insulating material in said trenches so as to fully expose said first layer of said first semiconductor material of said fin structure and to expose at least a portion of said second layer of said second semiconductor material of said fin structure.

8. A method of forming a FinFET device comprising a channel region and a plurality of source/drain regions, the method comprising:

forming a plurality of spaced-apart trenches that extend at least partially into a semiconductor substrate, said trenches defining a fin structure for said device comprised of a first semiconductor material positioned on said semiconductor substrate and a second semiconductor material positioned on said first semiconductor material, wherein said first semiconductor material is selectively etchable relative to said semiconductor substrate and said second semiconductor material and wherein said fin structure extends in a gate-length direction across what will become said channel region and said source/drain regions for said device;

forming a patterned layer of insulating material above said fin structure, said patterned layer of insulating material having an opening at a location that corresponds approximately to a location of said channel region for said FinFET device;

while masking portions of said fin structure with said patterned layer of insulating material, performing at least one selective isotropic etching process through said opening in said patterned layer of insulating material to selectively remove a portion of said first semiconductor material relative to said second semiconductor material and said substrate so as to thereby define a space between said second semiconductor material and said semiconductor substrate;

filling substantially all of said space between said second semiconductor material and said semiconductor substrate with an insulating material so as to thereby define a substantially self-aligned channel isolation region positioned under at least what will become said channel region of said device;

after filling substantially all of said space with said insulating material, forming a sacrificial gate structure within said opening in said patterned layer of insulating material;

removing said patterned layer of insulating material;

forming at least one sidewall spacer adjacent said sacrificial gate structure;

forming a layer of insulating material adjacent said sidewall spacer;

performing at least one etching process to remove said sacrificial gate structure to thereby define a gate cavity; and forming a final gate structure in said gate cavity.

9. The method of claim 8, wherein said semiconductor substrate and said second semiconductor material are silicon and said first semiconductor material is silicon/germanium ($Si_xGe_{1-x}$).

10. The method of claim 8, wherein said semiconductor substrate and said second semiconductor material are comprised of the same material.

11. The method of claim 8, wherein filling substantially all of said space between said second semiconductor material and said semiconductor substrate with said insulating material comprises performing a conformal deposition process to fill substantially all of said space between said second semiconductor material and said substrate with silicon dioxide by depositing a layer of silicon dioxide with a thickness that is about one-half of a vertical thickness of said space.

12. The method of claim 8, wherein, prior to forming said patterned layer of insulating material, the method further comprises forming an insulating material in said trenches and recessing said layer of insulating material in said trenches so as to fully expose said first semiconductor material of said fin structure and to expose at least a portion of said second semiconductor material of said fin structure.

13. A method of forming a FinFET device comprising a channel region and a plurality of source/drain regions, the method comprising:

forming a patterned layer of insulating material above a fin structure comprised of an upper portion, a lower portion and an intermediate portion that is positioned vertically between said upper and lower portions of said fin structure, said patterned layer of insulating material having an opening at a location that corresponds approximately to a location of said channel region for said FinFET device;

while masking portions of said fin structure with said patterned layer of insulating material, performing at least one selective etching process through said opening in said patterned layer of insulating material to selectively remove said intermediate portion of said fin structure relative to said upper and lower portions of said fin structure so as to thereby define a space between said upper and lower portions of said fin structure;

filling substantially all of said space between said upper and lower portions of said fin structure with an insulating material so as to thereby define a substantially self-aligned channel isolation region positioned under at least what will become said channel region of said device;

after filling substantially all of said space with said insulating material, forming a sacrificial gate structure within said opening in said patterned layer of insulating material;

removing said patterned layer of insulating material;

forming at least one sidewall spacer adjacent said sacrificial gate structure;

forming a layer of insulating material adjacent said sidewall spacer;

performing at least one etching process to remove said sacrificial gate structure to thereby define a gate cavity; and forming a final gate structure in said gate cavity.

14. The method of claim 13, wherein said upper and lower portions of said fin structure are made of silicon and said intermediate portion of said fin structure is made of silicon/germanium ($Si_xGe_{1-x}$).

15. The method of claim 13, wherein said upper and lower portions of said fin structure are comprised of the same material.

16. The method of claim 13, wherein filling substantially all of said space between said upper and lower portions of said fin structure with said insulating material comprises performing a conformal deposition process to fill substantially all of said space between said upper and lower portions of said fin structure with silicon dioxide by depositing a layer of silicon dioxide with a thickness that is about one-half of a vertical thickness of said space.

17. The method of claim 13, wherein, prior to forming said patterned layer of insulating material, the method further comprises forming an insulating material in trenches adjacent said fin structure and recessing said layer of insulating material in said trenches so as to fully expose said upper portion of said fin structure and to expose at least a portion of said intermediate portion of said fin structure.

18. The method of claim 13, wherein performing said at least one selective etching process through said opening in said patterned layer of insulating material comprises performing an isotropic etching process through said opening in said patterned layer of insulating material.

* * * * *